(12) United States Patent
Hatakeyama

(10) Patent No.: US 9,017,923 B2
(45) Date of Patent: Apr. 28, 2015

(54) NEGATIVE RESIST COMPOSITION AND PATTERNING PROCESS USING THE SAME

(71) Applicant: Shin-Etsu Chemical Co., Ltd., Tokyo (JP)

(72) Inventor: Jun Hatakeyama, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/089,371

(22) Filed: Nov. 25, 2013

(65) Prior Publication Data
US 2014/0170560 A1 Jun. 19, 2014

(30) Foreign Application Priority Data
Dec. 18, 2012 (JP) ................. 2012-276014

(51) Int. Cl.
*C08F 30/04* (2006.01)
*G03F 7/40* (2006.01)
*G03F 7/038* (2006.01)
*G03F 7/20* (2006.01)

(52) U.S. Cl.
CPC ............ *G03F 7/0384* (2013.01); *G03F 7/0382* (2013.01); *G03F 7/20* (2013.01)

(58) Field of Classification Search
USPC .............. 430/270.1, 913, 927, 331, 330, 322, 430/325; 525/326.6; 526/241
See application file for complete search history.

(56) References Cited

U.S. PATENT DOCUMENTS

| | | | |
|---|---|---|---|
| 6,171,757 B1 * | 1/2001 | Angelopoulos et al. ... | 430/270.1 |
| 6,436,605 B1 | 8/2002 | Angelopoulos et al. | |
| 6,458,907 B1 * | 10/2002 | Angelopoulos et al. ...... | 526/241 |
| 2002/0081521 A1 | 6/2002 | Takeda et al. | |
| 2008/0090172 A1 | 4/2008 | Hatakeyama et al. | |
| 2008/0118860 A1 | 5/2008 | Harada et al. | |
| 2008/0241736 A1 | 10/2008 | Kobayashi et al. | |
| 2011/0171579 A1 * | 7/2011 | Domon et al. ............. | 430/285.1 |
| 2011/0212390 A1 * | 9/2011 | Masunaga et al. ................. | 430/5 |
| 2011/0287234 A1 * | 11/2011 | Tsuchihashi et al. ...... | 428/195.1 |

FOREIGN PATENT DOCUMENTS

| | | |
|---|---|---|
| JP | A-2001-66767 | 3/2001 |
| JP | A-2006-169302 | 6/2006 |
| JP | B2-3790649 | 6/2006 |
| JP | B2-3865048 | 1/2007 |
| JP | A-2008-111103 | 5/2008 |
| JP | A-2008-122932 | 5/2008 |
| JP | A-2008-239918 | 10/2008 |

OTHER PUBLICATIONS

Pittman et al, Polymerization of Ferrocenylmethyl Acrylate and Ferrocenylmethyl Methacrylate. Characterization of Their Polymers and Their Polymeric Ferricinium Salts. Extension to Poly(ferricenylethylene), Macromolecules, vol. 3, (6), pp. 746-754 (1970).*
Archer, Inorganic and Organometallic Polymers, Wiley-VCH, Inc. (2001).*

* cited by examiner

*Primary Examiner* — Amanda C. Walke
(74) *Attorney, Agent, or Firm* — Oliff PLC

(57) ABSTRACT

The invention provides a negative resist composition including, as a base resin, a polymer that contains at least a repeating unit "a" having a cyclopentadienyl complex and is represented by the following general formula (1). There can be a negative resist composition, especially a chemically amplified negative resist composition that has a higher resolution than conventional hydroxystyrene-based and novolak-based negative resist compositions, a good pattern configuration after exposure, and further excellent etching resistance, and a patterning process using the same.

(1)

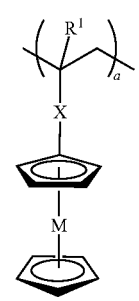

17 Claims, No Drawings

NEGATIVE RESIST COMPOSITION AND PATTERNING PROCESS USING THE SAME

BACKGROUND OF THE INVENTION

1. Field of the Invention

The present invention relates to a negative resist composition using a polymer suitable for a base resin for a negative resist composition, especially for a chemically amplified negative resist composition, and a patterning process.

2. Description of the Related Art

As LSI progresses toward a high integration and a further acceleration in speed, a miniaturization of a pattern rule rapidly progresses. In particular, the expansion of a flash memory market and the enlargement of a memory capacity lead the finer pattern. As an advanced miniaturization technology, mass production of a 65-nm node device by ArF lithography is achieved. Preparation of mass production of a 45-nm node device by next generation ArF immersion lithography progresses. For a next generation 32-nm node device, immersion lithography by a ultra high NA lens including a liquid having a higher refractive index than water, a high-refractive index lens, and a high-refractive index resist film, extreme ultraviolet (EUV) lithography of 13.5-nm wavelength, a double exposure (double patterning lithography) of ArF lithography, and the like are considered as candidates, and are studied.

In a high energy beam of an extremely short wavelength such as an electron beam (EB) and an X-ray, a light element such as a hydrocarbon used for a resist composition has almost no absorption, and thus a resist composition based on polyhydroxystyrene has been studied.

As the exposure apparatus for mask production, an EB exposure apparatus are used instead of a laser beam exposure apparatus to increase the accuracy of line width. Since a further miniaturization becomes possible by increasing the acceleration voltage of an electron beam gun in the EB exposure apparatus, an acceleration voltage of 10 kV to 30 kV is used, 50 kV becomes a mainstream recently, and an acceleration voltage of 100 kV is also investigated.

As the acceleration voltage increases, a decrease in sensitivity of a resist film becomes a problem. As the acceleration voltage increases, the influence of forward scattering in a resist film becomes reduced. Therefore, the contrast of electron drawing energy is improved to increase resolution and dimensional control. However, electrons pass through the resist film with free draining condition, and therefore the sensitivity of the resist film is decreased. Since a mask exposure machine is used for exposure by direct continuous writing, a decrease in the sensitivity of the resist film leads to a decrease in productivity, and therefore the machine is not preferred. In view of a request for a higher sensitivity, a chemically amplified resist composition is contemplated.

As miniaturization of a pattern of EB lithography for mask production progresses, the thickness of a resist film is decreased to prevent pattern fall due to a high aspect ratio at the time of development. In a case of photolithography, the decrease in the thickness of a resist film contributes greatly to an improvement in a resolution. This is because flattening of a device is promoted by introduction of a CMP and the like. In the mask production, a substrate is flat, and thus the film thickness of the substrate to be processed (e.g., Cr, MoSi, and $SiO_2$) is determined by the light shielding rate and the phase difference control. In order to decrease the thickness of a film, an improvement in dry-etching resistance of a resist is necessary.

It is generally assumed that the carbon density and dry-etching resistance of a resist correlate to each other. Since the EB drawing is not affected by absorption, a resist based on a novolak polymer having excellent etching resistance is developed.

For an improvement in the etching resistance, styrene copolymerization has been first proposed, and indene copolymerization disclosed in Patent Document 1 has been proposed. Further, acenaphthylene copolymerization described in Patent Document 2 is effective in the improvement of etching resistance due to not only high carbon density but also a rigid main chain structure of a cycloolefin structure.

In addition, Patent Document 3 proposes a method for improving the etching resistance by blending a compound containing yttrium, aluminum, iron, titanium, zirconium, or hafnium in an existing resist compound. Examples of a compound containing iron include ferrocene compounds such as ferrocenealdehyde, ferrocenemethanol, ferroceneethanol, ferrocene carboxylic acid, and ferrocene dicarboxylic acid.

PRIOR ART DOCUMENTS

Patent Documents

Patent Document 1: Japanese Patent No. 3865048
Patent Document 2: Japanese Patent Laid-Open Publication No. 2006-169302
Patent Document 3: Japanese Patent Laid-Open Publication No. 2001-066767

SUMMARY OF THE INVENTION

The present invention is made in view of the above situation, and an object of the present invention is to provide a negative resist composition, especially a chemically amplified negative resist composition that has a higher resolution than conventional hydroxystyrene-based and novolak-based negative resist compositions, a good pattern configuration after exposure, and further excellent etching resistance, and a patterning process using the same.

In order to solve the problems, the present invention provides a negative resist composition including, as a base resin, a polymer that contains at least a repeating unit "a" having a cyclopentadienyl complex and is represented by the following general formula (1),

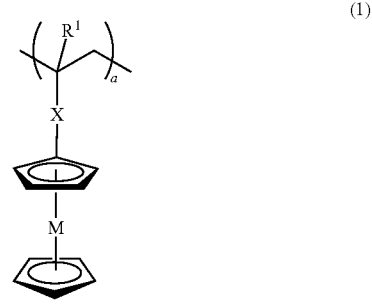

wherein $R^1$ represents a hydrogen atom or a methyl group; X represents a single bond, a methylene group, —C(=O)—O—$R^2$—, —O—$R^2$—, —O—C(=O)—$R^2$—, or —Ar—$R^2$—; "M" represents Fe, Co, Ni, Cr, or Ru; Ar represents a phenylene group or a naphthylene group; $R^2$ is the same or different single bond, a linear, a branched, or a cyclic alkylene group having 1 to 6 carbon atoms, an arylene group having 6 to 10 carbon atoms, or an alkenylene group having 2 to 10 carbon atoms, may contain an ester group or an ether group; and "a" represents within a range of 0<a<1.0.

Such a negative resist composition has a high sensitivity and a high resolution after exposure to a high energy beam, and thus has extremely excellent etching resistance. Because of the characteristics, the negative resist composition has extremely high practicality and is suitable for the VLSI manufacture or for a micropatterning material in photomask patterning.

A polymer that contains the repeating unit "a" in the general formula (1) and a repeating unit "b" having a hydroxy group and is represented by the following general formula (2) is preferably used as a base resin.

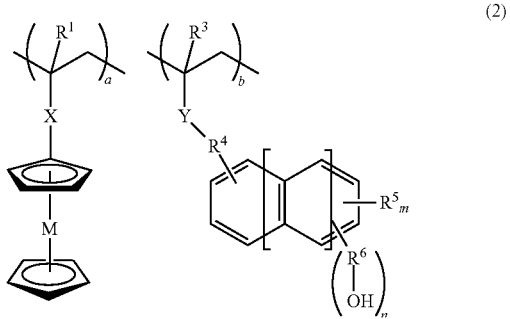

(2)

In formula (2), $R^1$, X, and M are as defined above; $R^3$ represents a hydrogen atom or a methyl group; Y represents a single bond, —C(=O)—O—, or —C(=O)—NH—; $R^4$ represents a single bond or a linear or a branched alkylene groups having 1 to 6 carbon atoms; $R^5$ represents a hydrogen atom, a fluorine atom, a trifluoromethyl group, a cyano group, or a linear, a branched, or a cyclic alkyl group, alkoxy group, alkoxycarbonyl group, acyl group, or acyloxy group having 1 to 6 carbon atoms; $R^6$ represents a single bond or a linear or a branched alkylene groups having 1 to 4 carbon atoms; "m" represents an integer of 0 to 4; "n" represents 1 or 2, "a" represents within a range of 0<a<1.0; and "b" represents within a range of 0<b<1.0.

When the polymer having the repeating unit "b" having a hydroxy group and the repeating unit "a" having a cyclopentadienyl complex is used as a base resin, the etching resistance is extremely high. In addition, a reduction in acid diffusion can decrease a difference in dimension between a sparse pattern and a dense pattern.

Further, the alkali dissolution rate of the polymer can be adjusted by changing the ratio of the repeating unit "b" having a hydroxy group. Therefore, a negative resist composition can have an appropriate alkali dissolution rate according to a condition.

The weight average molecular weight of the polymer is preferably within a range of 1,000 to 500,000.

When the polymer has a weight average molecular weight of 1,000 to 500,000, a resist composition has sufficient heat resistance and alkali solubility, and can suppress an undercutting phenomenon after patterning.

In the present invention, it is preferable that a chemically amplified resist material contain an acid generator.

When the negative resist composition is thus a chemically amplified resist material containing an acid generator, an extremely high-precision pattern can be obtained.

In the present invention, at least one component selected from an organic solvent, a basic compound, a dissolution control agent, a surfactant, and a cross-linking agent can be contained.

For example, when an organic solvent is added, the coating properties of the resist composition to a substrate or the like can be improved. When a basic compound is added, the rate of acid diffusion in a resist film can be suppressed, and the resolution can be further improved. When a dissolution control agent is added, the difference in dissolution rate between exposed and unexposed regions can be increased, and the resolution can be further improved. When a surfactant is added, the coating properties of the resist composition can be further improved or controlled. When a cross-linking agent is added, the resolution can be further improved.

The present invention provides a patterning process including the steps of applying the negative resist composition to a substrate; heating the composition; exposing the composition to a high energy beam; and developing the composition with a developer.

According to the patterning process using the negative resist compression of the present invention, a micropattern can be formed. This patterning process can be used for patterning on a semiconductor substrate, a mask substrate, or the like.

The negative resist composition of the present invention has a high sensitivity, a high resolution, a good pattern configuration after exposure, an inhibited rate of acid diffusion, and excellent etching resistance. Accordingly, a negative resist composition, in particular a chemically amplified negative resist composition especially suitable for the VLSI manufacture or for a micropatterning material of a photomask can be obtained. The negative resist composition is used not only in lithography for the formation of a semiconductor circuit, but also in the formation of a mask circuit pattern or in the formation a micromachine, and a thin-film magnetic head circuit.

DETAILED DESCRIPTION OF THE PREFERRED EMBODIMENTS

Hereinafter, the present invention will be described in detail.

As mentioned above, the development of the negative resist composition that has a high sensitivity, a high resolution, a large exposure margin, excellent process applicability, a good pattern configuration after exposure, particularly a small difference in dimensions between a dense pattern and a sparse pattern, and further excellent etching resistance is expected.

The present inventors have extensively investigated to obtain a negative resist composition having a high sensitivity, a high resolution, a large exposure margin, and a good etching configuration, and showing excellent etching resistance, all of which are desired in recent years.

The present inventors have first considered a resist composition containing metal to improve the etching resistance. However, a metal salt is subjected to ion exchange with an acid generated from an acid generator to form a salt neutralized with the acid, inhibiting a deprotection reaction. Therefore, a large amount of metal salt cannot be added.

On the other hand, ferrocene is not ionic since cyclopentadien and iron are coordinately bonded through a covalent bond, and therefore ferrocene does not act as an acid quencher. Accordingly, many metals such as Fe, Co, Ni, Cr, and Ru can be introduced into a resist as a cyclopentadienyl complex. As a result, the etching resistance is largely improved. Further, the inventors have found that the metals have absorption with respect to an energy beam such as EB or EUV, and thus the sensitivity of the resist is improved.

The inventors have confirmed that when a polymer obtained by copolymerization of a repeating unit having a cyclopentadienyl complex and a repeating unit having a cross-linked hydroxy group is used as a negative resist composition, the etching resistance is extremely high, a reduction in acid diffusion can decrease a difference in dimension between a sparse pattern and a dense pattern, and the effect is higher than a hydrocarbon compound such as styrene, vinylbiphenyl, indene, vinylnaphthalene, and acenaphthylene.

Therefore, the inventors have found that by using a polymer containing a repeating unit having a cyclopentadienyl complex as a base resin of a negative resist composition, especially a chemically amplified negative resist composition, a negative resist composition, especially a chemically amplified negative resist composition, that has a high sensitively, a high resolution, and a good pattern configuration after exposure, shows excellent etching resistance, and is suitable for the VLSI manufacture or for a micropatterning material of a photomask can be obtained. The present invention has been completed.

Hereinafter, the present invention will be further specifically described.

The negative resist composition according to the present invention includes, as a base resin, a polymer that contains at least a repeating unit "a" having a cyclopentadienyl complex and is represented by the following general formula (1),

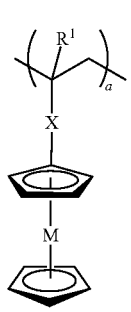

(1)

wherein $R^1$ represents a hydrogen atom or a methyl group; X represents a single bond, a methylene group, —C(=O)—O—$R^2$—, —O—$R^2$—, —O—C(=O)—$R^2$—, or —Ar—$R^2$—; "M" represents Fe, Co, Ni, Cr, or Ru; Ar represents a phenylene group or a naphthylene group; $R^2$ is the same or different single bond, a linear, a branched, or a cyclic alkylene group having 1 to 6 carbon atoms, an arylene group having 6 to 10 carbon atoms, or an alkenylene group having 2 to 10 carbon atoms, may contain an ester group or an ether group; and "a" represents within a range of 0<a<1.0.

The negative resist composition of the present invention particularly has a high sensitivity, a high resolution, a large exposure margin, excellent process applicability, a good pattern configuration after exposure, particularly a small difference in dimension between a dense pattern and a sparse pattern, and further excellent etching resistance. Accordingly, the composition has an extremely high practicality because of these excellent characteristics and is very useful as a resist composition for a VLSI and as a mask pattern forming material.

Illustrative examples of olefin containing a cyclopentadienyl complex represented by the repeating unit "a" in the general formula (1) include as follows:

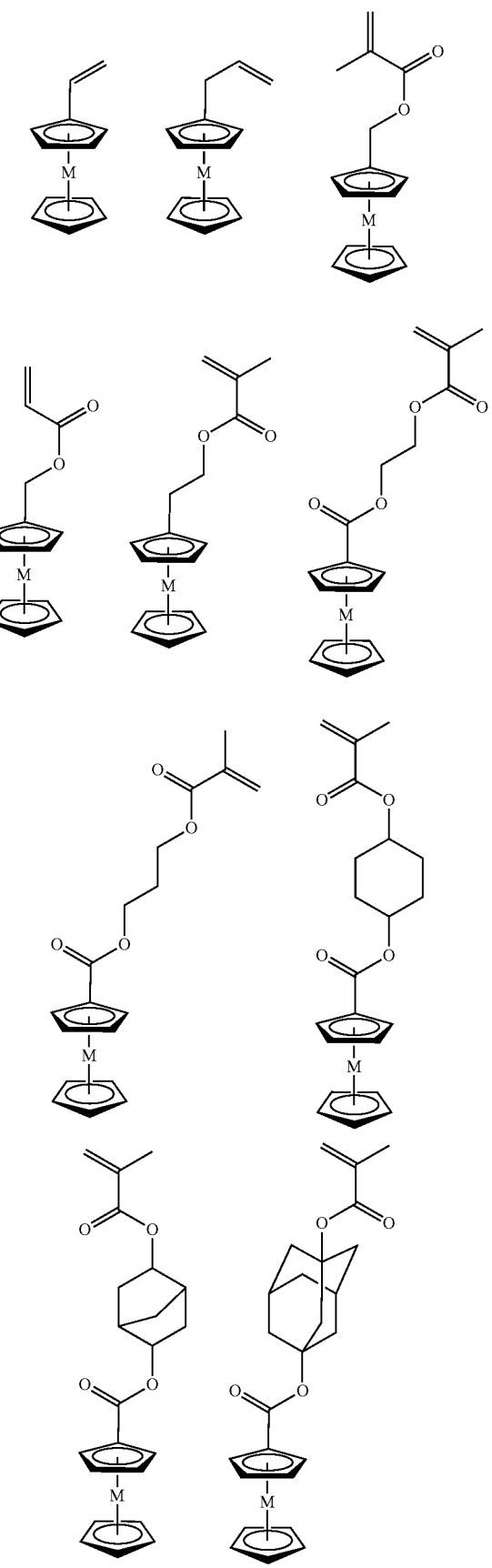

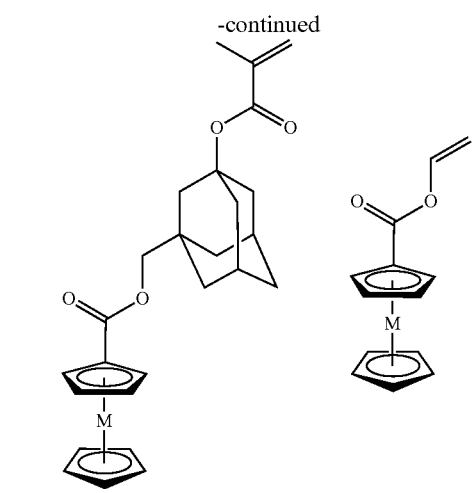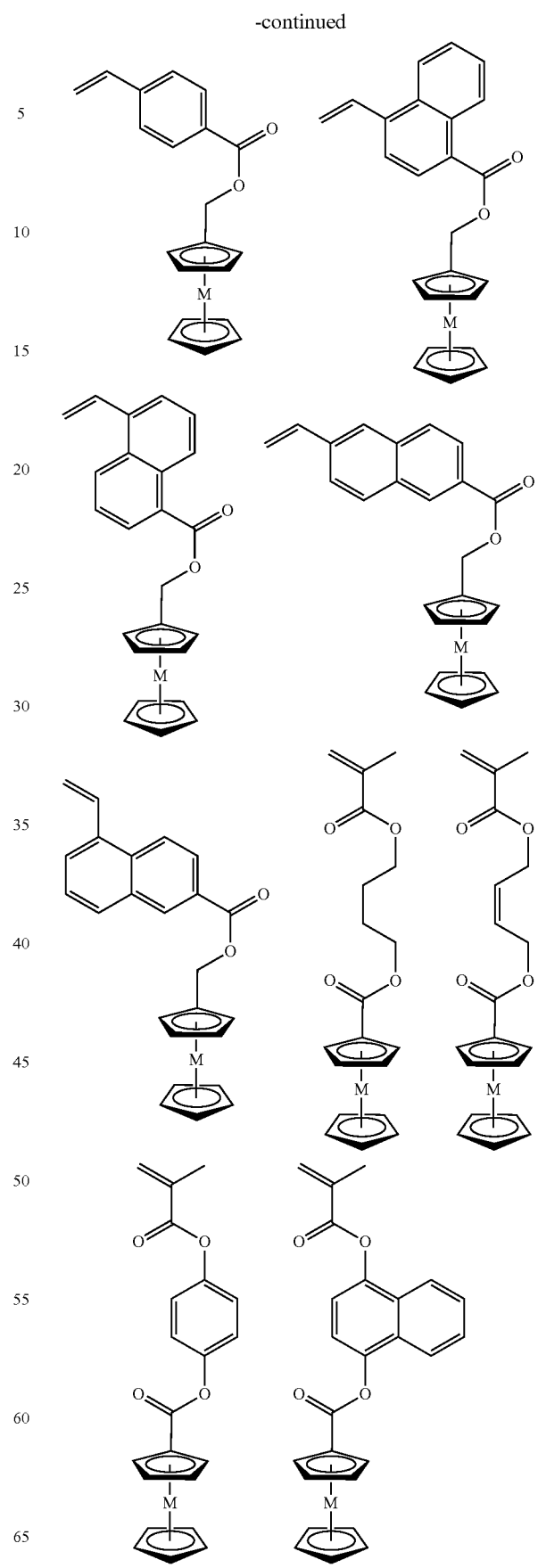

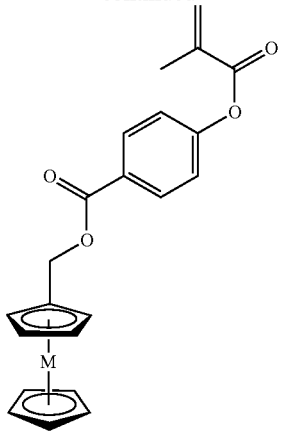
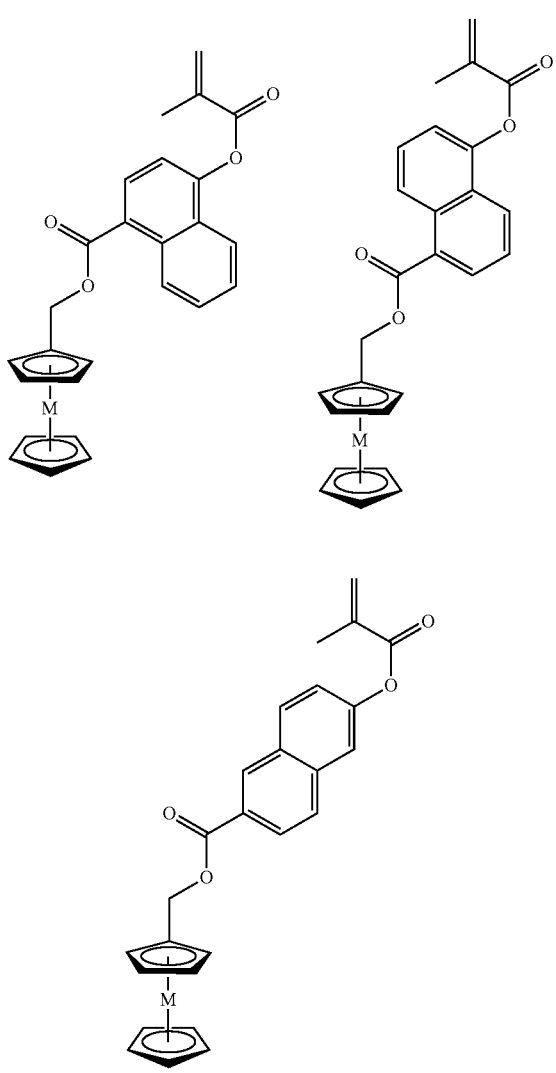

In the formulae, M is as defined above.

In particular, the negative resist composition of the present invention may contain, as a base resin, a polymer that contains the repeating unit "a" in the general formula (1) and a repeating unit "b" having a hydroxy group and is represented by the following general formula (2),

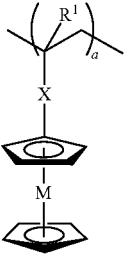
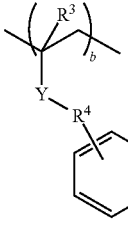

(2)

wherein $R^1$, X, and M are as defined above; $R^3$ represents a hydrogen atom or a methyl group; Y represents a single bond, —C(=O)—O—, or —C(=O)—NH—; $R^4$ represents a single bond or a linear or a branched alkylene groups having 1 to 6 carbon atoms; $R^5$ represents a hydrogen atom, a fluorine atom, a trifluoromethyl group, a cyano group, or a linear, a branched, or a cyclic alkyl group, alkoxy group, alkoxycarbonyl group, acyl group, or acyloxy group having 1 to 6 carbon atoms; $R^6$ represents a single bond or a linear or a branched alkylene groups having 1 to 4 carbon atoms; "m" represents an integer of 0 to 4; "n" represents 1 or 2, "a" represents within a range of 0<a<1.0; and "b" represents within a range of 0<b<1.0.

Illustrative examples of a monomer for obtaining a repeating unit "b" having a hydroxy group may be as follows.

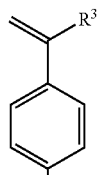
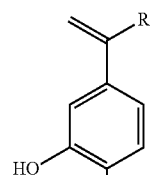
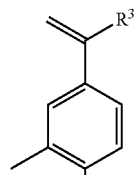
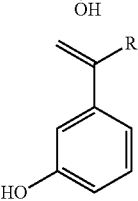
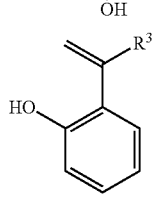
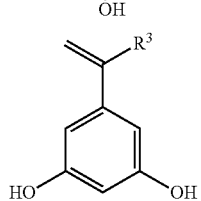
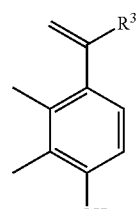
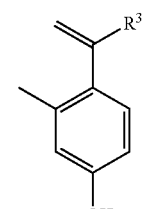
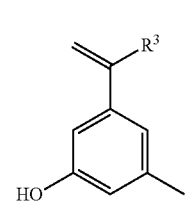
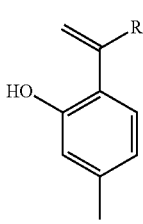
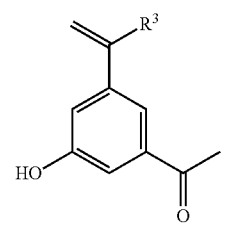

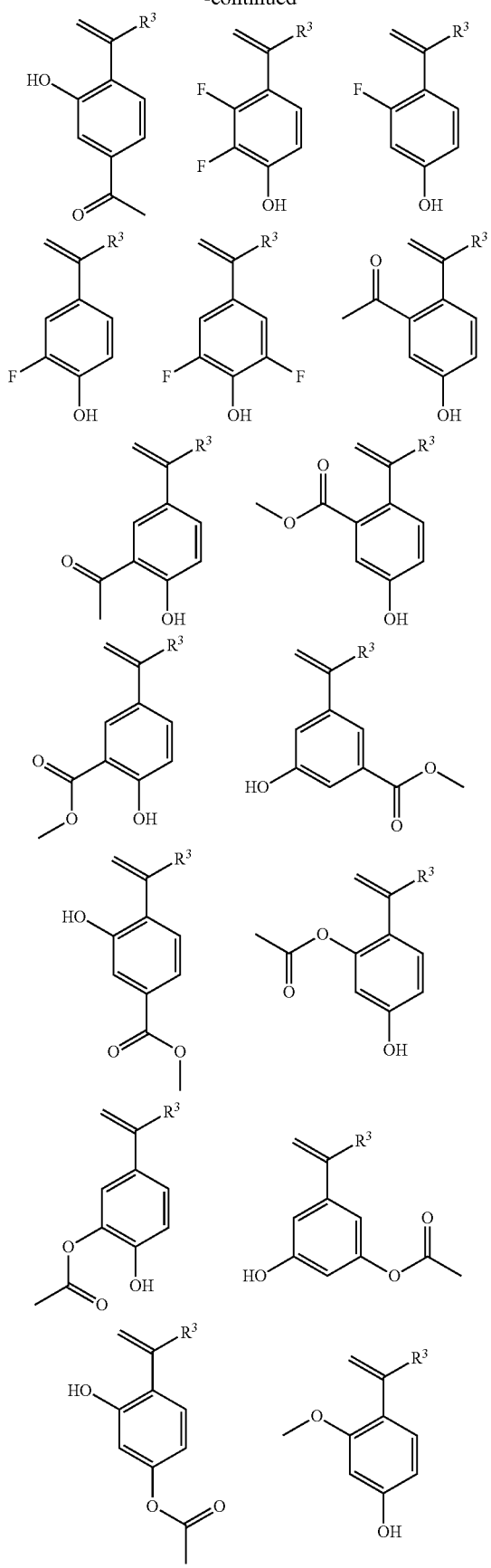
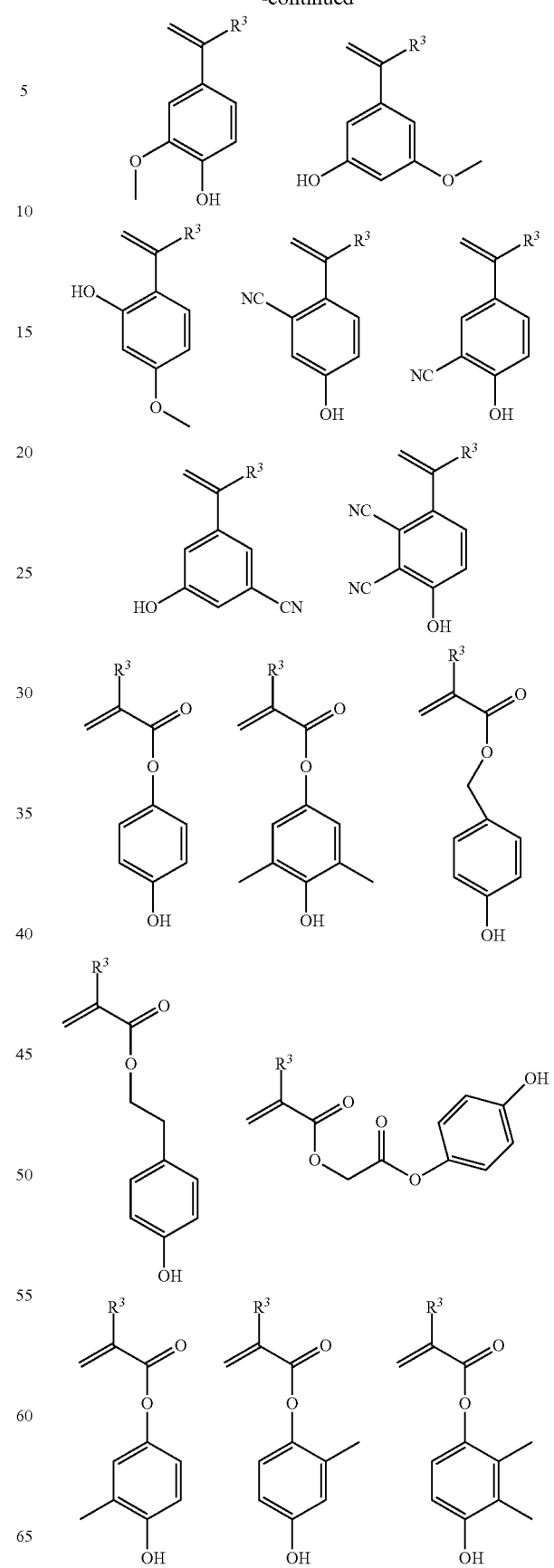

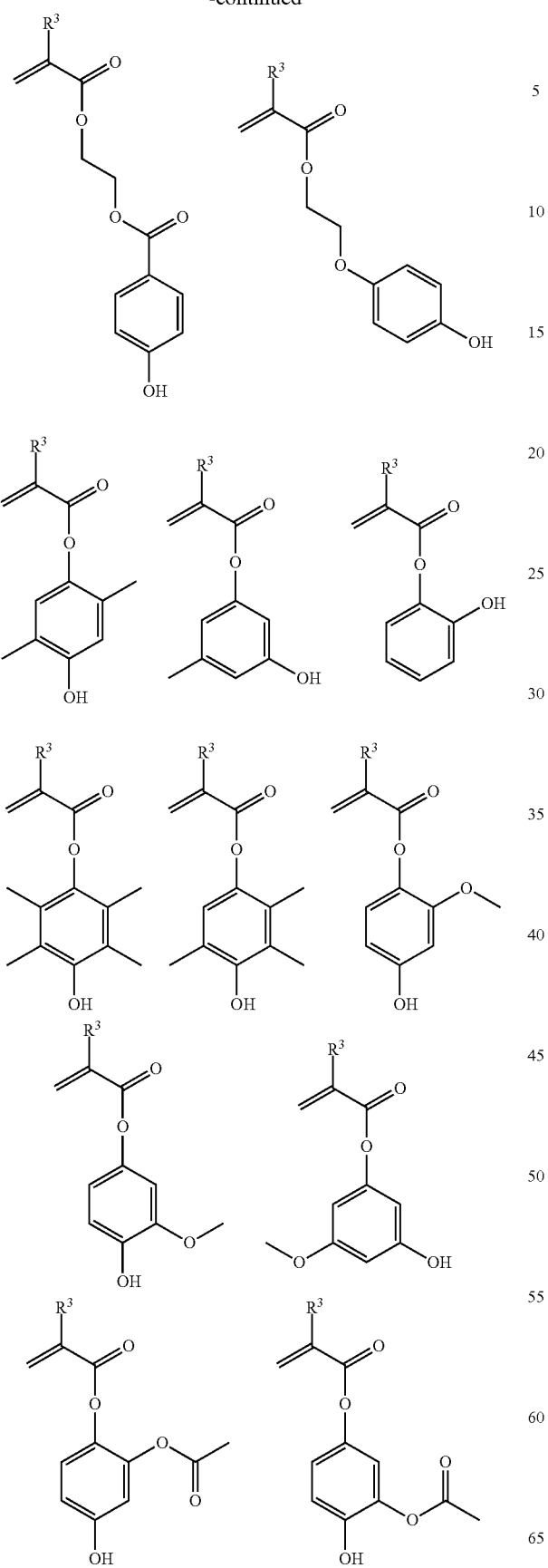
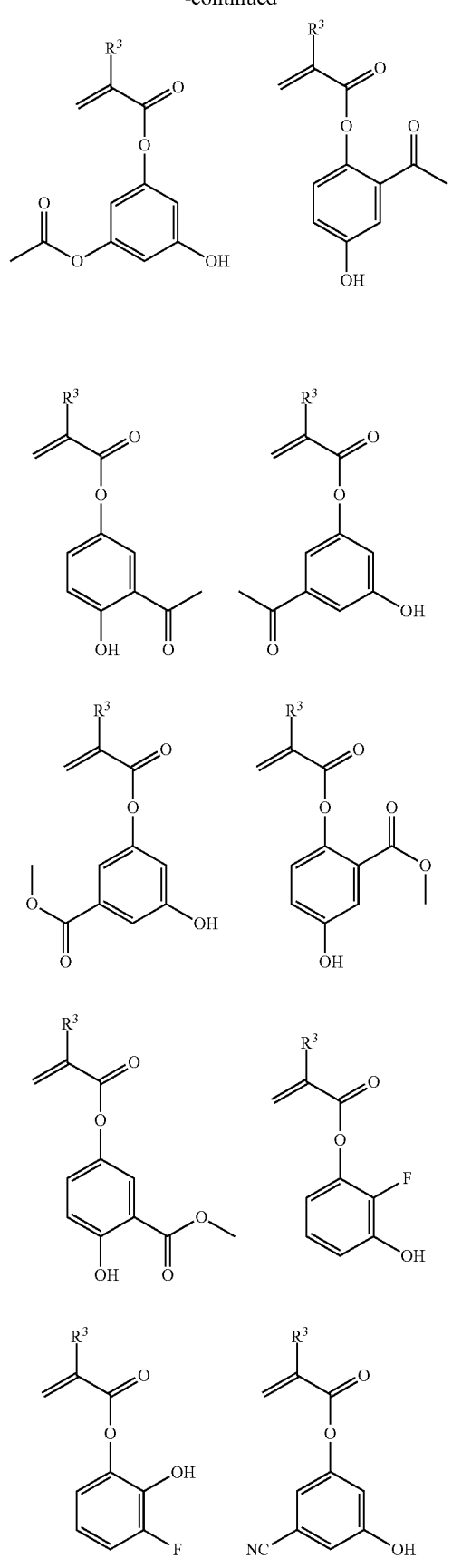

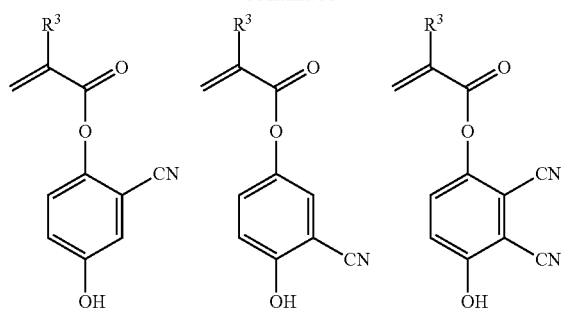
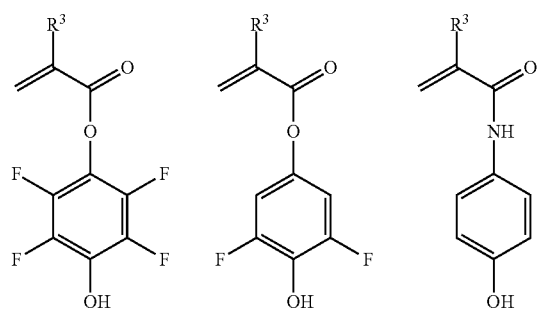
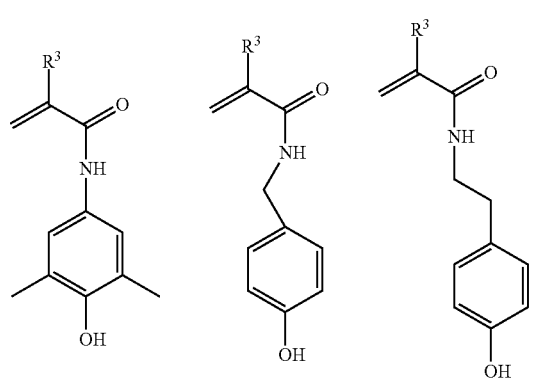
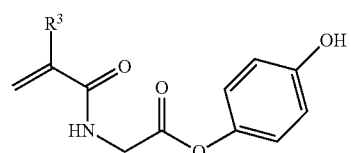
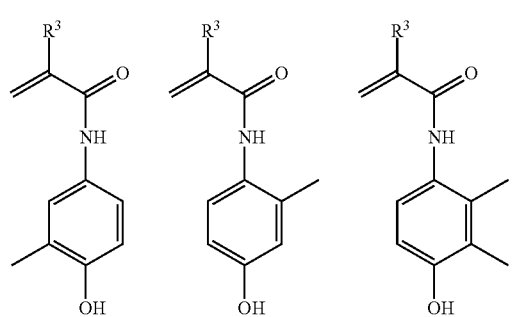
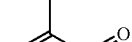
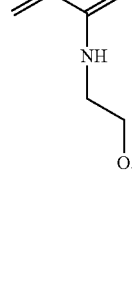
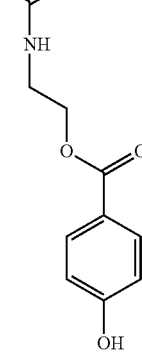
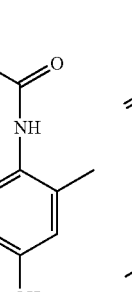
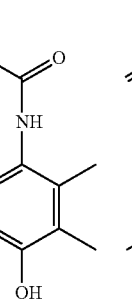
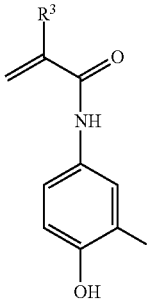
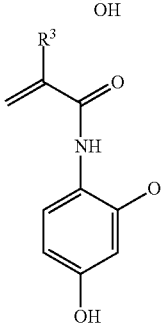

-continued
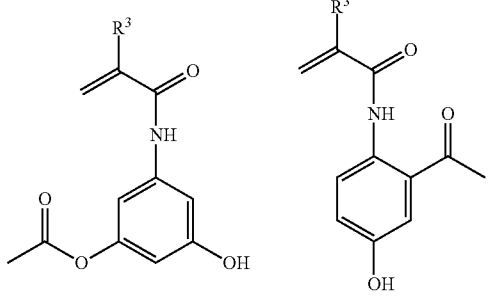
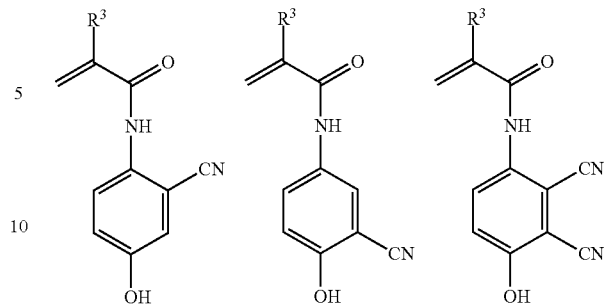
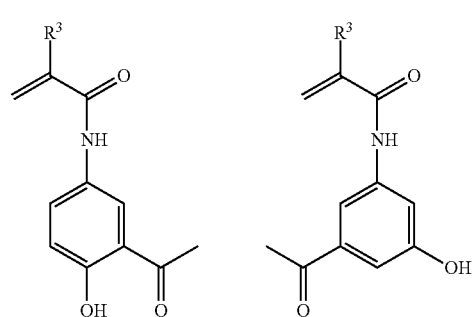
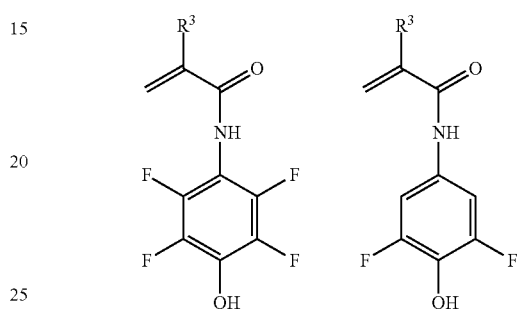
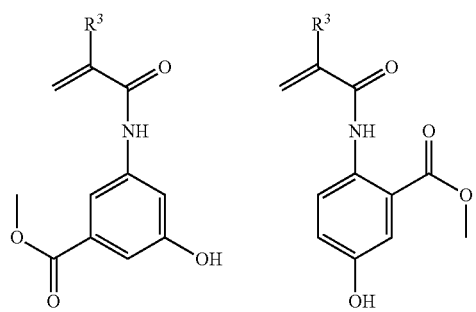
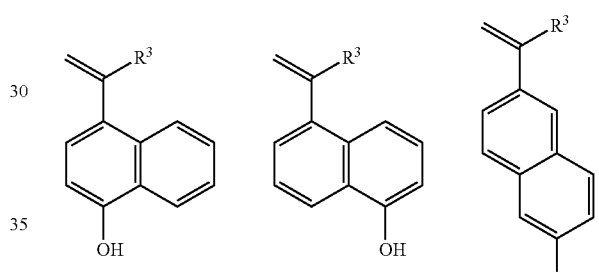
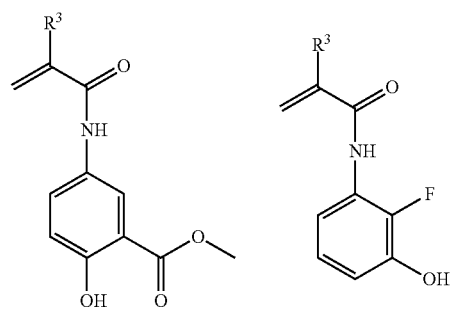
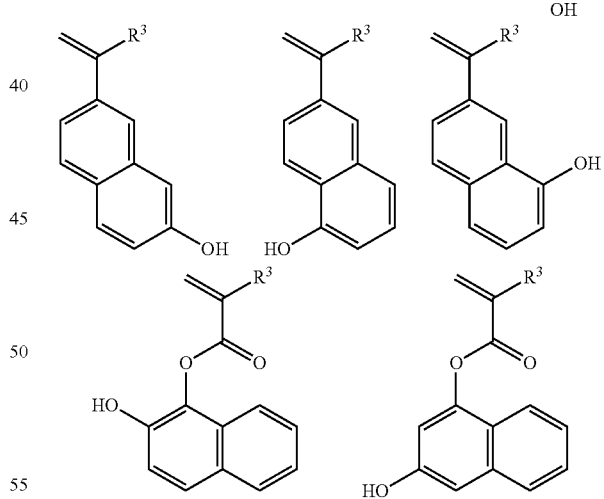
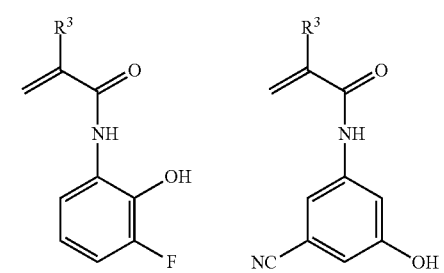
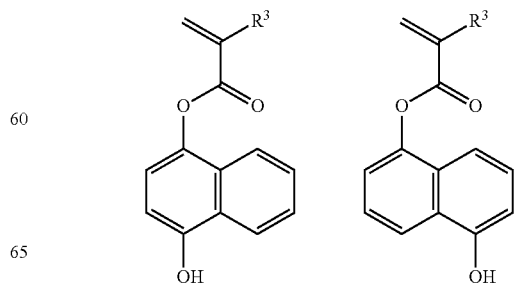

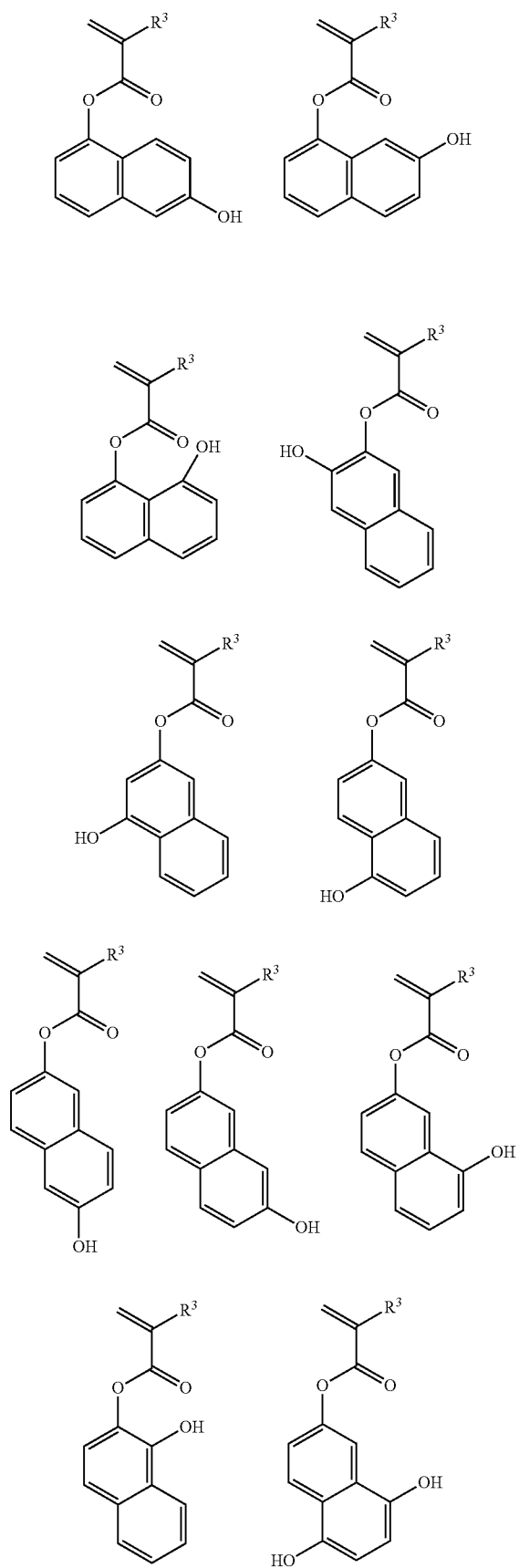

-continued
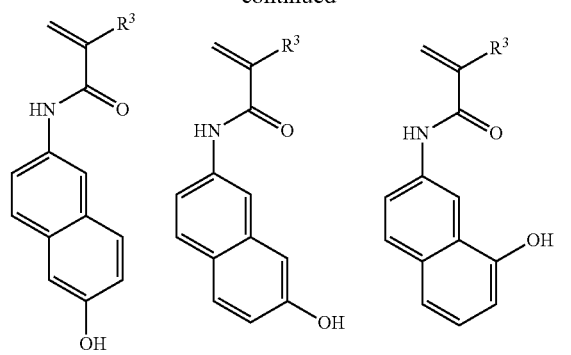
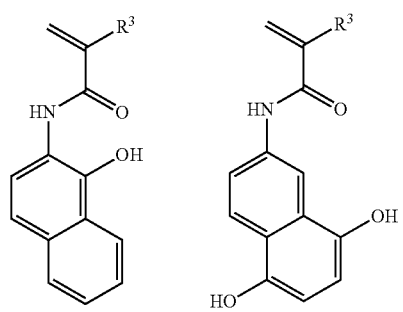
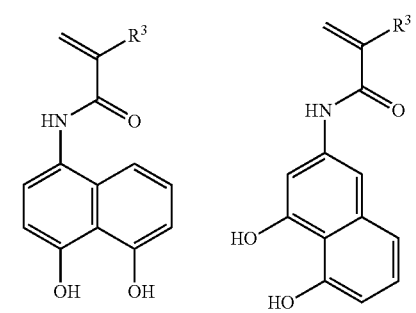
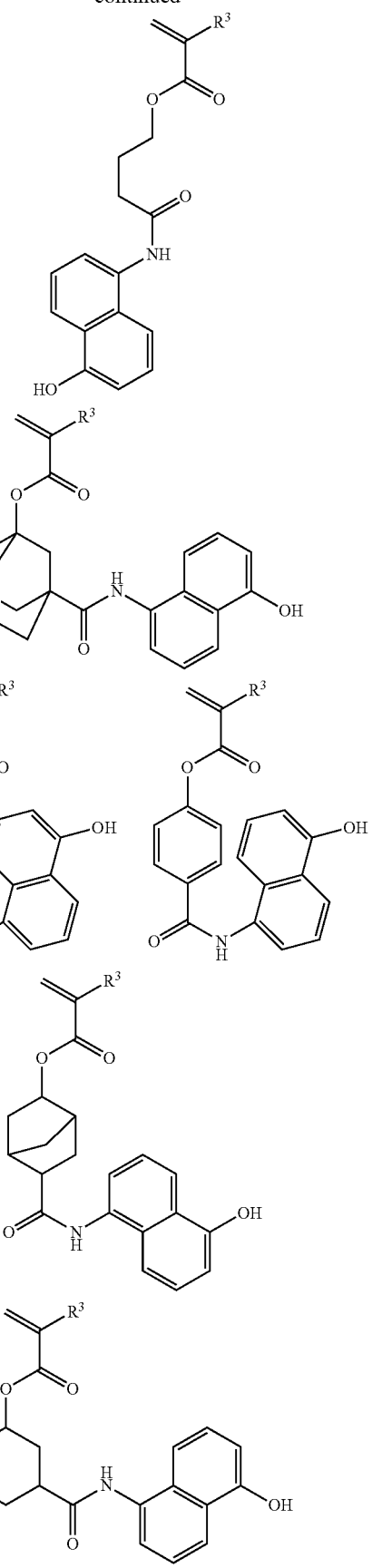

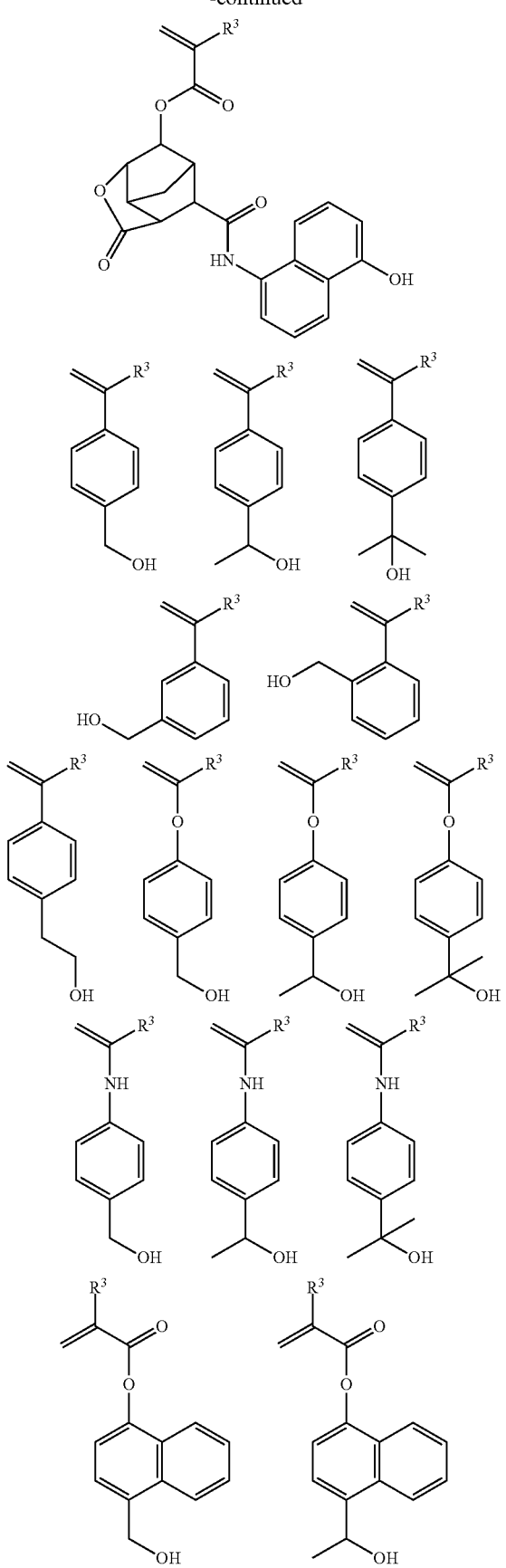

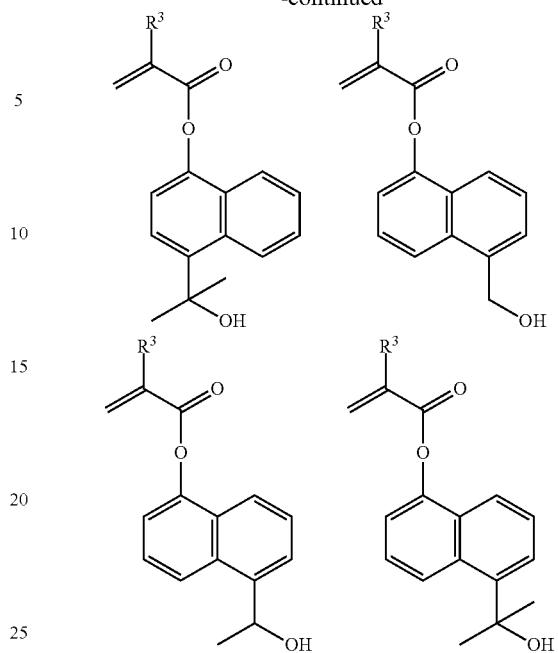

The polymer of the present invention represented by the general formula (2) contains the repeating unit "b" having a hydroxy group as the essential requirement, but it may also be copolymerized additionally with a repeating unit "c" other than the repeating unit "b".

Illustrative examples thereof include repeating units having indene, hydroxyindene, styrene, vinylnaphthalene, vinylanthracene, vinylpyrene, indole, acenaphthylene, norbornadiene, norbornene, tricyclododecene, tetracyclododecene, methyleneindane, chromone, coumarone, (meth)acrylates having lactone, (meth)acrylic acid, a 3-hydroxyadamantane (meth)acrylate ester, maleic anhydride, itaconic anhydride, maleimides, vinyl ethers, α-hydroxymethyl acrylates, styrenecarboxylic acid, and α-trifluoromethyl alcohol.

Among these, a repeating unit p having α-trifluoromethyl alcohol is for example, represented by the following general formula (3),

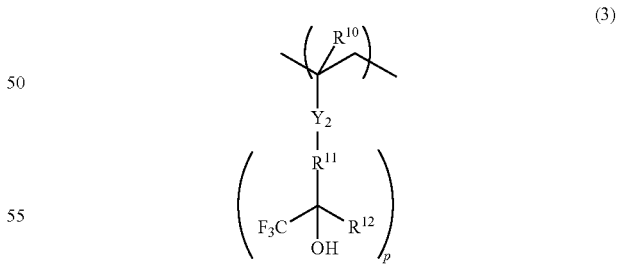

(3)

wherein $R^{10}$ represents a hydrogen atom or a methyl group; $Y_2$ represents a single bond, a benzene ring, —O—, —C(=O)—O—, or —C(=O)—O—$R^{13}$—C(=O)—O—; $R^{13}$ represents a linear, a branched, or a cyclic alkylene group having 1 to 10 carbon atoms, may contain an alkylene group substituted by fluorine or a trifluoromethyl group; $R^{11}$ represents a single bond or a linear, a branched, or a cyclic alkylene group having 1 to 10 carbon atoms, or may be substituted by fluorine or have a trifluoromethyl group; $R^{12}$ represents a hydrogen atom, a fluorine atom, a methyl group, a trifluoromethyl group, or a difluoromethyl group, or $R^{12}$ may be bonded to $R^{11}$ to form a ring which may have an ether group, an alkylene group substituted by fluorine, or a trifluoromethyl group; and "p" represents 1 or 2.

Illustrative examples of a monomer for obtaining the repeating unit having α-trifluoromethyl alcohol represented by the general formula (3) may be as follows. In the following formulae, $R^{10}$ is as defined above.

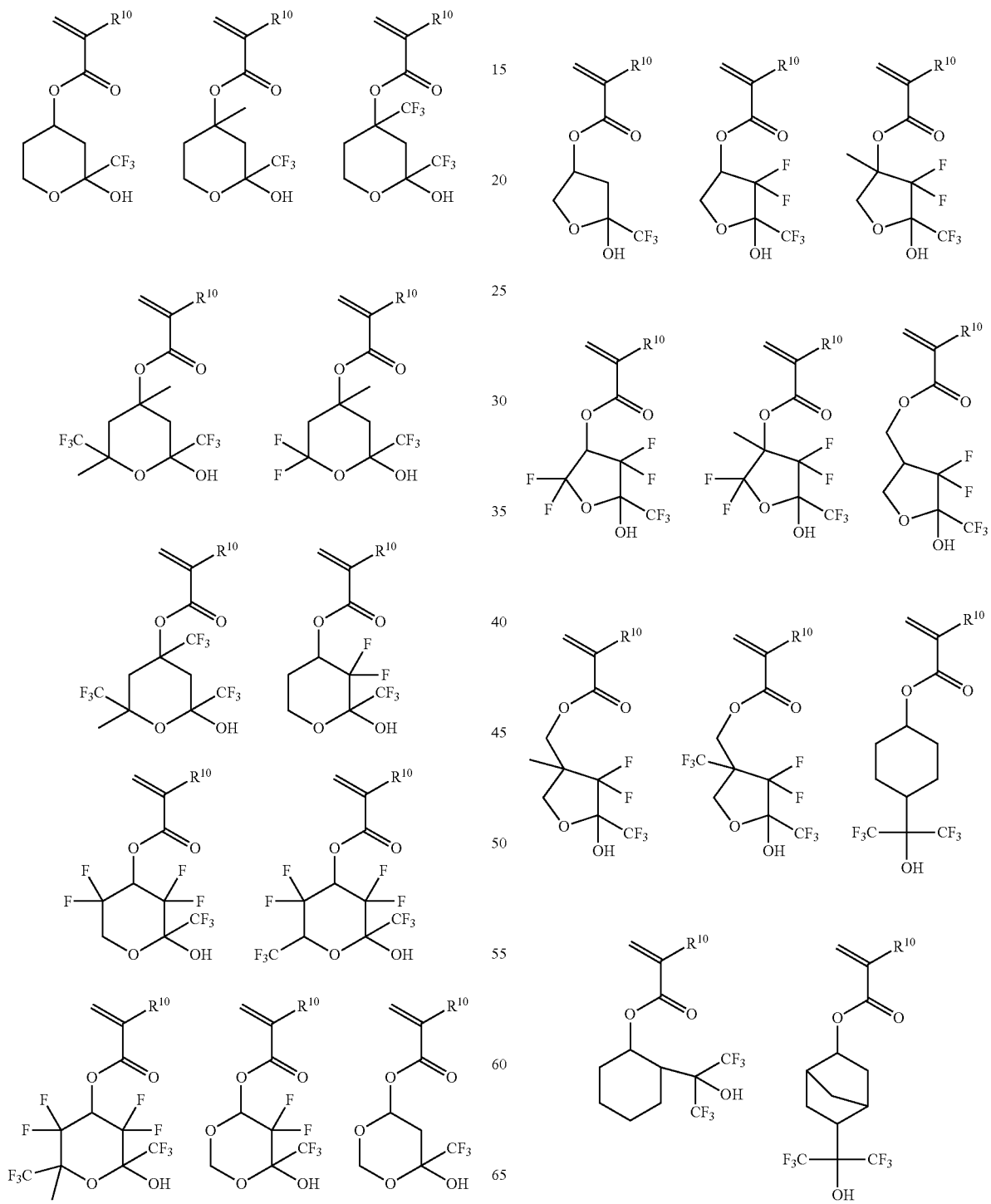

-continued
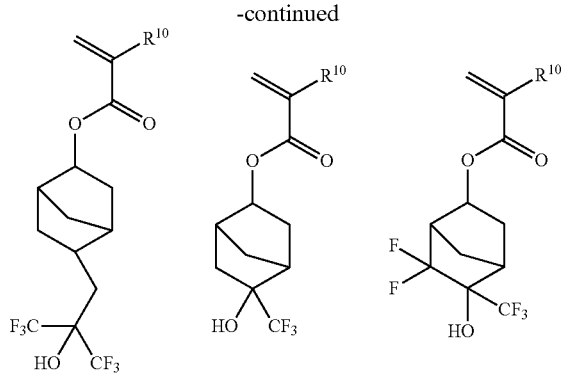
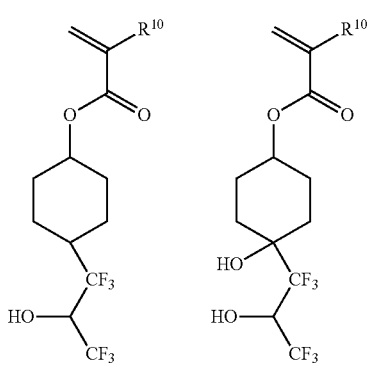
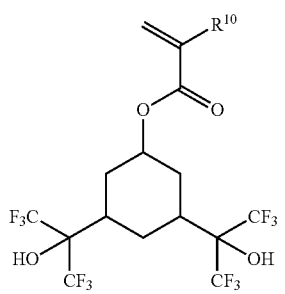
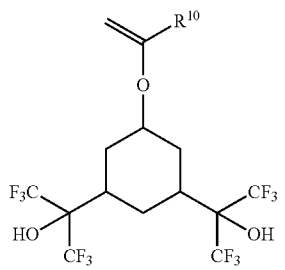
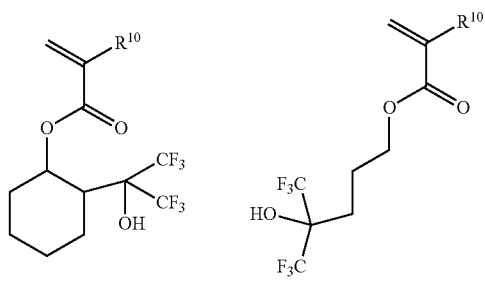
-continued
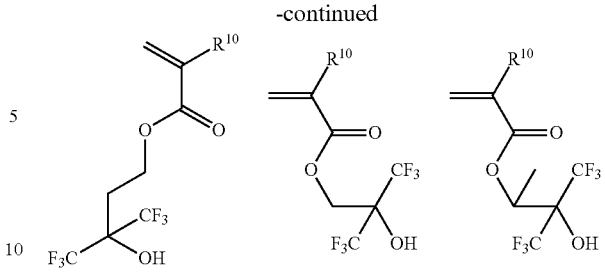
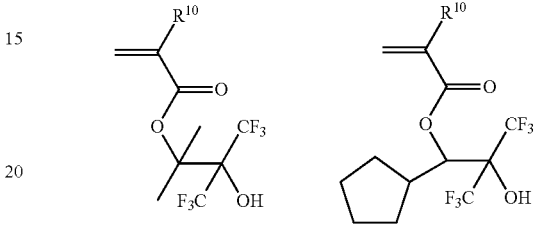
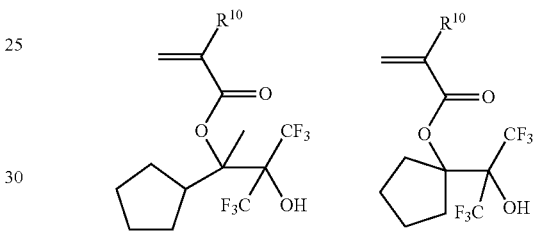
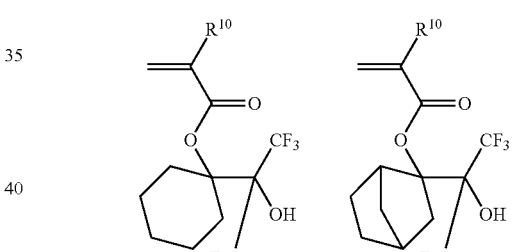
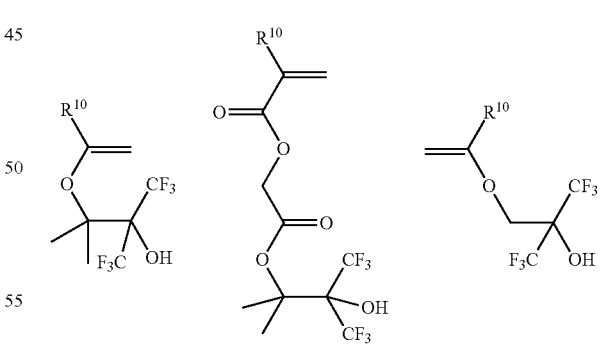
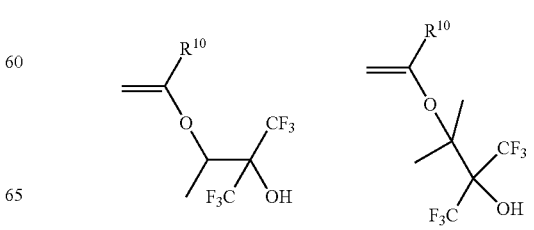

-continued
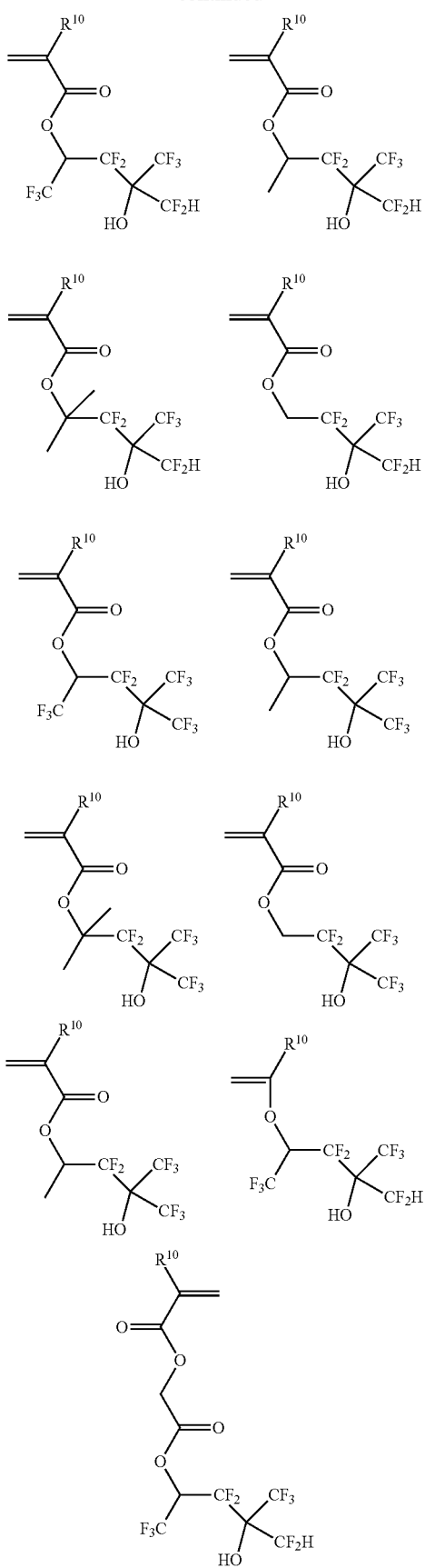
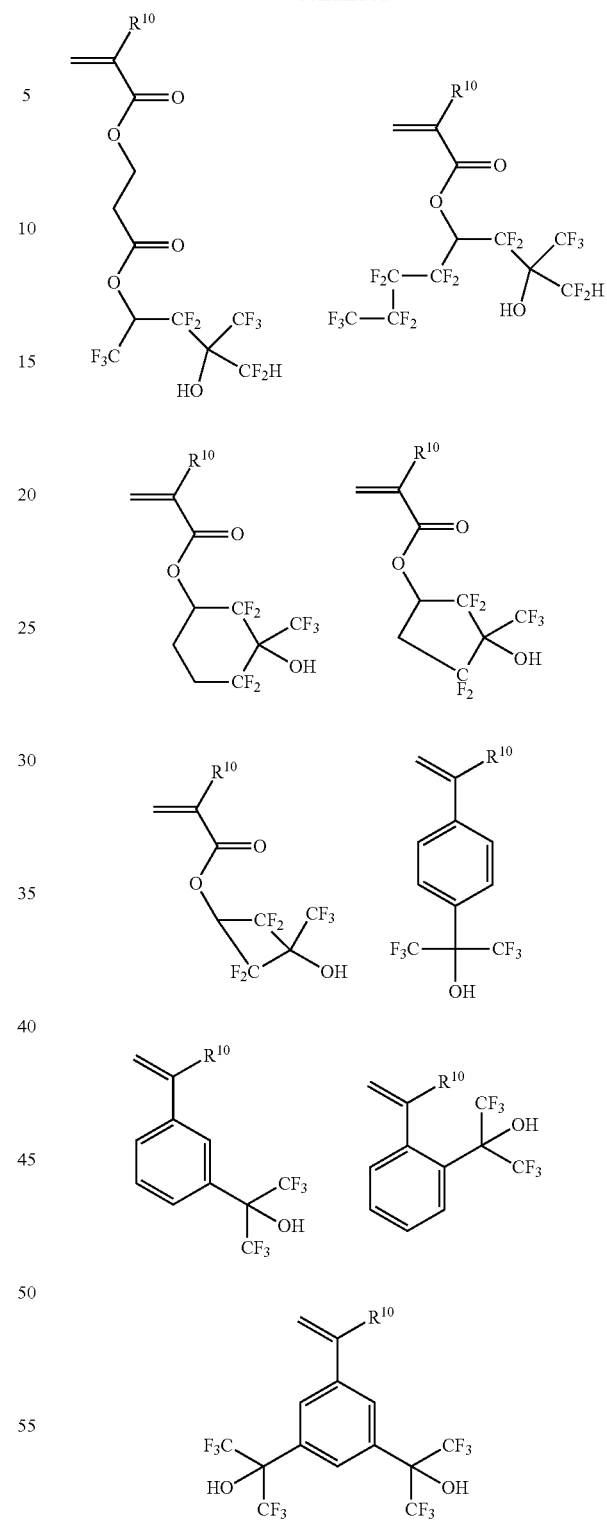
In the present invention, repeating units d1, d2, and d3, that contain a sulfonium salt and are represented by the following general formula (4), may be copolymerized,

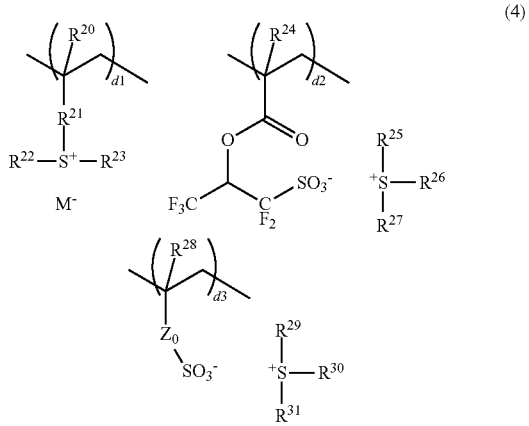

(4)

wherein $R^{20}$, $R^{24}$, and $R^{28}$ represent a hydrogen atom or a methyl group; $R^{21}$ represents a single bond, a phenylene group, —O—R—, or —C(=O)—$Y_3$—R—; $Y_3$ represents an oxygen atom or NH; R represents a linear, a branched, or a cyclic alkylene group having 1 to 6 carbon atoms, a phenylene group, or an alkenylene group, may contain a carbonyl group, an ester group, an ether group, or a hydroxy group; $R^{22}$, $R^{23}$, $R^{25}$, $R^{26}$, $R^{27}$, $R^{29}$, $R^{30}$ and $R^{31}$ represent the same or different linear, branched, or cyclic alkyl groups having 1 to 12 carbon atoms, may contain a carbonyl group, an ester group, or an ether group, or represent an aryl group having 6 to 12 carbon atoms, an aralkyl group or a thiophenyl group having 7 to 20 carbon atoms; $Z_0$ represents a single bond, a methylene group, an ethylene group, a phenylene group, a fluorinated phenylene group, —O—$R^{32}$—, or —C(=O)—$Z_1$—$R^{32}$—; $Z_1$ represents an oxygen atom or NH; $R^{32}$ represents a linear, a branched, or a cyclic alkylene group having 1 to 6 carbon atoms, a phenylene group, or an alkenylene group, may contain a carbonyl group, an ester group, an ether group, or a hydroxy group; $M^-$ represents a non-nucleophilic counter ion; and d1, d2, and d3 satisfy $0 \leq d1 \leq 0.3$, $0 \leq d2 \leq 0.3$, and $0 \leq d1+d2+d3 \leq 0.3$.

Examples of the non-nucleophilic counter ion $M^-$ include a halide ion such as a chloride ion and bromide ion; a fluoroalkyl sulfonate such as triflate, 1,1,1-trifluoroethane sulfonate, and nonafluorobutane sulfonate; an aryl sulfonate such as tosylate, benzene sulfonate, 4-fluorobenzene sulfonate, and 1,2,3,4,5-pentafluorobenzene sulfonate; an alkyl sulfonate such as mesylate and butane sufonate; an imide such as bis(trifluoromethylsulfonyl)imide, bis(perfluoroethylsulfonyl)imide, and bis(perfluorobutylsulfonyl)imide; and methide such as tris(trifluoromethylsulfonyl)methide and tris(perfluoroethylsulfonyl)methide.

The acid diffusion is decreased by bonding an acid generator to a polymer mainchain, and as a result, a reduction in the resolution due to a blur by the acid diffusion can be prevented. Further, line edge roughness (LER and LWR) is improved by uniformly dispersing the acid generator.

In order to synthesize a polymer as a base resin of the negative resist composition of the present invention, a polymer of a copolymer can be obtained by one method in which a radical polymerization initiator is added to a desired monomer among monomers for obtaining repeating units a to d (d1 to d3) in an organic solvent to perform heat polymerization.

Examples of such an organic solvent used in the polymerization include toluene, benzene, tetrahydrofuran, diethyl ether, and dioxane. Examples of the polymerization initiator include 2,2'-azobisisobutyronitrile (AIBN), 2,2'-azobis(2,4-dimethylvaleronitrile), dimethyl 2,2'-azobis(2-methylpropionate), benzoyl peroxide, and lauroyl peroxide. The polymerization initiator can be heated preferably at 50 to 80° C. to achieve polymerization. The reaction time is 2 to 100 hours, and preferably 5 to 20 hours.

The repeating unit "b" having a hydroxy group in the general formula (2) can be obtained by a method in which a hydroxyl group of a monomer is substituted by an acetoxy group, and the monomer is polymerized and subjected to alkaline hydrolysis to a hydroxy group.

As a base used for the alkaline hydrolysis, an aqueous ammonium, triethylamine, or the like may be used. The reaction temperature is –20 to 100° C., and preferably 0 to 60° C. The reaction time is 0.2 to 100 hours, and preferably 0.5 to 20 hours.

In order to adjust the alkali dissolution rate of the polymer (hydroxylated polyvinyl naphthalene or a hydroxy vinyl naphthalene copolymer) after the polymerization, a hydrogen atom in the hydroxy group of hydroxy vinyl naphthalene can be substituted by an acetyl group, an alkyl group, or the like. It is preferable that the substitution ratio be more than 1% and 40% or less of the hydroxy group. By a substitution method in which acetyl chloride or a halogenated alkyl compound is reacted with a polymer in the presence of a base, a polymer in which a hydrogen atom in the hydroxy group (phenolic hydroxyl group) of hydroxylated vinyl naphthalene is partially protected by an acetyl group or an alkyl group can be obtained.

The weight average molecular weight of the polymer of the present invention is preferably within a range of 1,000 to 500,000, and more preferably 2,000 to 30,000. When the polymer has a weight average molecular weight of 1,000 or more, a resist composition has sufficient heat resistance, and when the polymer has a weight average molecular weight of 500,000 or less, a resist composition has sufficient alkali solubility. At this time, an undercutting phenomenon after patterning may not almost occur.

Further, the molecular weight distribution of the polymer of the present invention is preferably 1.0 to 2.0, and particularly preferably within a narrow range of 1.0 to 1.5. When the polymer has such a molecular weight distribution, there is little possibility that a foreign matter may appear on a pattern after exposure and the pattern configuration may be deteriorated due to the presence of polymers having lower and higher molecular weight. As the pattern rule becomes finer, the influences of molecular weight and molecular weight distribution become stronger. Therefore, in order to obtain a resist composition suitable for a fine pattern dimension, the above-mentioned molecular weight distribution is preferable.

Further, in the polymer of the present invention, it may also be possible to blend two or more polymers having different composition ratios, molecular weight distributions, and molecular weights.

When a negative resist composition is prepared by using the polymer of the present invention as the base resin and combining it appropriately with an organic solvent, an acid generator, a cross-linking agent, a dissolution inhibitor, a basic compound, or a surfactant, according to the propose, the dissolution rate of the polymer in a developer at the exposed region is decreased through a catalytic reaction.

Therefore, the negative resist composition of the present invention has a high dissolution contrast of the resist film, a high resolution, a large exposure margin, a good process applicability, and further excellent etching resistance with a good pattern configuration after exposure, especially a small difference in dimension between a dense pattern and a sparse pattern due to decreased diffusion of an acid, and an extremely high sensitivity. From this effect, the negative resist composition of the present invention has a high practicality, and is useful for a resist composition for a VLSI.

Specifically, when an acid generator is added to produce a chemically amplified negative resist composition capable of utilizing an acid catalytic reaction, the chemically amplified negative resist composition has a higher sensitively and further excellent characteristics, and thus is extremely useful.

When a basic compound is further added, for example, the diffusion rate of the acid in the resist film can be suppressed to further improve the resolution. Further, a sensitivity change after exposure is suppressed, a dependency on a substrate and an environment is reduced, and an exposure margin, a pattern profile, and the like can be improved.

When a surfactant is added, the coating properties of the resist composition can be further improved or controlled.

As the acid generator in the negative resist composition of the present invention, for example, a compound (photoacid generator) generating an acid in respond to active light beam or radiation may be contained. A component of a photoacid generator may be a compound generating an acid under high energy irradiation. A suitable photoacid generator includes a sulfonium salt, an iodonium salt, sulfonyldiazomethane, N-sulfonyloxyimide, and an oxime-O-sulfonate acid generator. The acid generators will be given hereinafter while they may be used singly or in a mixture of two or more kinds.

Illustrative examples thereof are disclosed in Japanese Patent Laid-Open Publication No. 2008-111103, paragraphs [0122] to [0142].

The negative resist composition of the present invention may further contain any one or more of an organic solvent, a basic compound, a dissolution control agent, a surfactant, and acetylene alcohols.

Illustrative examples of the organic solvent include ketones such as and cyclohexanone and methyl 2-n-amyl ketone; alcohols such as 3-methoxy butanol, 3-methyl-3-methoxy buthanol, 1-methoxy-2-propanol, and 1-ethoxy-2-propanol; ethers such as propyleneglycol monomethyl ether, ethyleneglycol monomethyl ether, propyleneglycol monoethyl ether, ethyleneglycol monoethyl ether, propyleneglycol dimethyl ether, and diethyleneglycol dimethyl ether; esters such as propyleneglycol monomethyl ether acetate, propyleneglycol monoethyl ether acetate, ethyl lactate, ethyl pilvate, butyl acetate, methyl 3-methoxypropionate, ethyl 3-ethoxypropionate, tert-butyl acetate, tert-butyl propionate, and propyleneglycol mono-tert-butyl ether acetate; and lactones such as γ-butyrolactone, which are disclosed in Japanese Patent Laid-Open Publication No. 2008-111103, paragraphs [0144] to [0145], and mixed solvents thereof. Illustrative examples of the basic compound include primary, secondary, and tertiary amine compounds, and especially an amine compound having a hydroxy group, an ether group, an ester group, a lactone ring, a cyano group, and a sulfonic acid ester group, which are disclosed in Japanese Patent Laid-Open Publication No. 2008-111103, paragraphs [0146] to [0164], and a compound having a carbamate group described in Japanese Patent No. 3790649. The surfactant is described in Japanese Patent Laid-Open Publication No. 2008-111103, paragraphs [0165] to [0166]. The dissolution control agent is described in Japanese Patent Laid-Open Publication No. 2008-122932, paragraphs [0155] to [0178], and acetylene alcohols are described in paragraphs [0179] to [0182]. Polymeric quenchers described in Japanese Patent Laid-Open Publication No. 2008-239918 may be also added. Since the polymeric quenchers are orientated on the surface of a coated resist film, the rectangularity of the resist pattern is enhanced. The polymeric quencher is effective for preventing film thinning of a pattern and rounding of the top of the pattern when a top coat for immersion lithography is applied.

The amount of the acid generator to be blended is preferably 0.01 to 100 parts by mass, and particularly preferably 0.1 to 80 parts by mass, relative to 100 parts by mass of base resin. The amount of the organic solvent to be blended is preferably 50 to 10,000 parts by mass, and particularly preferably 100 to 5,000 parts by mass, relative to 100 parts by mass of base resin. The amount of the dissolution control agent to be blended is preferably 0 to 50 parts by mass, and particularly preferably 0 to 40 parts by mass, and the amount of the basic compound to be blended is preferably 0 to 100 parts by mass, and particularly preferably 0.001 to 50 parts by mass, and the amount of the surfactant to be blended is preferably 0 to 10 parts by mass, and particularly preferably 0.0001 to 5 parts by mass, relative to 100 parts by mass of base resin.

As mentioned above, the negative resist composition of the present invention can further contain a cross-linking agent. Illustrative examples of a cross-linking agent capable of being used in the present invention may include a melamine compound, a guanamine compound, a glycoluril compound, or a urea compound that is substituted by at least one group selected from a methylol group, an alkoxymethyl group, and an acyloxymethyl group, an epoxy compound, an isocyanate compound, an azide compound, and a compound containing a double bond such as an alkenyl ether group. The cross-linking agents may be used as an additive, and may be introduced in a side chain of the polymer as a pendant group. Further, a compound containing a hydroxy group may be used as the cross-linking agent.

Among the illustrative examples of the cross-linking agent, examples of the epoxy compound include tris(2,3-epoxypropyl)isocyanurate, trimethylolmethane triglycidyl ether, trimethylolpropane triglycidyl ether, and triethylolethane triglycidyl ether. Illustrative examples of the melamine compound include hexamethylolmelamine, hexamethoxymethyl melamine, compounds in which 1 to 6 methylol groups of hexamethylolmelamine are converted into methoxymethyl groups or a mixture thereof, hexamethoxyethyl melamine, hexaacyloxymethyl melamine, and compounds in which 1 to 6 methylol groups of hexamethylolmelamine are converted into acyloxymethyl groups or a mixture thereof. Examples of the guanamine compound include tetramethylol guanamine, tetramethoxymethyl guanamine, compounds in which 1 to 4 methylol groups of tetramethylol guanamine are converted into methoxymethyl groups or a mixture thereof, tetramethoxyethyl guanamine, tetraacyloxy guanamine, and compounds in which 1 to 4 methylol groups of tetramethylol guanamine are converted into acyloxymethyl groups or a mixture thereof. Examples of the glycoluril compound include tetramethylol glycoluril, tetramethoxy glycoluril, tetramethoxymethyl glycoluril, compounds in which 1 to 4 methylol groups of tetramethylol glycoluril are converted into methoxymethyl groups or a mixture thereof, and compounds in which 1 to 4 methylol groups of tetramethylol glycoluril are converted into acyloxymethyl groups or a mixture thereof. Examples of the urea compound include tetramethylolurea, tetramethoxymethylurea, compounds in which 1 to 4 methylol groups of tetramethylolurea are converted into methoxymethyl groups or a mixture thereof, and tetramethoxyethylurea.

Examples of the isocyanate compound include trilene diisocyanate, diphenylmethane diisocyanate, hexamethylene diisocyanate, and cyclohexane diisocyanate. Examples of the azide compound include 1,1'-biphenyl-4,4'-bisazide, 4,4'-methylidenebisazide, and 4,4'-oxybisazide.

Examples of the compound containing an alkenyl ether group include ethyleneglycol divinyl ether, triethyleneglycol divinyl ether, 1,2-propanediol divinyl ether, 1,4-butanediol divinyl ether, tetramethyleneglycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

The amount of the cross-linking agent to be blended is 0 to 50 parts, preferably 5 to 50 parts, and more preferably 10 to 30 parts, relative to 100 parts of base resin. The cross-linking agents may be used singly or in a mixture of two or more kinds. When the amount is 5 parts or more, sufficient resolution can be improved, and when the amount is 50 parts or less, there is little possibility in which patterns are connected to decrease the resolution.

When the negative resist composition of the present invention, for example, the chemically amplified negative resist composition containing an organic solvent, a polymer represented by the general formula (2), an acid generator, and a basic compound, is used for manufacture of various integrated circuits, a publicly known lithography technology that is not particularly limited may be applied.

Further, in the negative resist composition of the present invention, a pattern can be formed on a semiconductor substrate, a mask substrate, or the like, at least by steps of applying the negative resist composition to the substrate, heating the composition, exposing the composition to a high energy beam, and developing the composition with a developer.

For example, the negative resist composition of the present invention is applied to a substrate for manufacture of an integrated circuit (Si, $SiO_2$, SiN, SiON, TiN, WSi, BPSG, SOG, an organic anti-reflection film, etc.) or a substrate for manufacture of a mask circuit (Cr, CrO, CrON, MoSi, etc.) by an appropriate coating method such as spin coating, roll coating, flow coating, dip coating, spray coating, and doctor coating so that the film thickness is 0.1 to 2.0 µm. The composition is pre-baked on a hot plate at 60 to 150° C. for 10 seconds to 30 minutes, and preferably at 80 to 120° C. for 30 seconds to 20 minutes. Subsequently, the substrate is exposed directly or through a prescribed mask by a light source selected from high energy beams such as a ultraviolet beam, a far-ultraviolet beam, an electronic beam, an X-ray, an excimer laser, a γ-ray, and a synchrotron radiation beam, to obtain a target pattern. The exposure amount is about 1 to about 200 $mJ/cm^2$ and preferably 10 to 100 $mJ/cm^2$, or 0.1 to 100 µC and preferably about 0.5 µC to about 50 µC. Then, the substrate is subjected to a post-exposure bake (PEB) on a hot plate at 60 to 150° C. for 10 seconds to 30 minutes, and preferably at 80 to 120° C. for 30 seconds to 20 minutes.

Further, a development is performed for 3 seconds to 3 minutes and preferably 5 seconds to 2 minutes with a developer of an alkaline aqueous solution such as 0.1 to 5% by mass, and preferably 2 to 3% by mass tetramethyl ammonium hydroxide (TMAH) by the ordinary method such as a dip method, a puddle method, and a spray method to form a target negative pattern in which a light irradiating part is not dissolved in the developer and an unexposed part is dissolved on a substrate.

EXAMPLES

The present invention will be specifically described with reference to Synthesis Examples, Comparative Synthesis Examples, Examples, and Comparative Examples, and the present invention is not limited to the following Examples. Hereinafter, GPC represents gel permeation chromatography.

Synthesis Example 1

Into a 2-L flask were charged 4.2 g of vinyl ferrocene and 13.0 g of 4-acetoxystyrene, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol solution to precipitate a white solid, the white solid was redissolved in a mixed solvent of 100 mL of methanol and 200 mL of tetrahydrofurane, 10 g of triethylamine and 10 g of water were added, and a deprotection reaction of the acetyl group was carried out at 70° C. for 5 hours. The resultant was neutralized with acetic acid. The reaction solution was concentrated, and dissolved in 100 mL of acetone. In a similar manner to those shown above, precipitation, filtration, and drying at 60° C. were carried out to obtain a white polymer. A $^{13}$C-NMR, a $^1$H-NMR, and a GPC of the polymer thus obtained were measured to obtain the following analysis results.
Copolymer Composition Ratio (Mole Ratio):
Vinyl ferrocene:4-hydroxystyrene=0.2:0.8
Weight average molecular weight (Mw)=4,600
Molecular weight distribution (Mw/Mn)=1.66
This polymer is designated as Polymer 1.

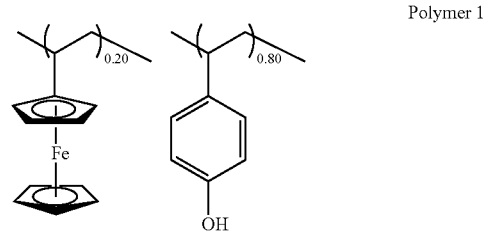

Polymer 1

Synthesis Example 2

Into a 2-L flask were charged 5.2 g of vinyl ruthenocene and 13.0 g of 4-acetoxystyrene, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol solution to precipitate a white solid, the white solid was redissolved in a mixed solvent of 100 mL of methanol and 200 mL of tetrahydrofurane, 10 g of triethylamine and 10 g of water were added, and a deprotection reaction of the acetyl group was carried out at 70° C. for 5 hours. The resultant was neutralized with acetic acid. The reaction solution was concentrated, and dissolved in 100 mL of acetone. In a similar manner to those shown above, precipitation, filtration, and drying at 60° C. were carried out to obtain a white polymer. A $^{13}$C-NMR, a $^1$H-NMR, and a GPC of the polymer thus obtained were measured to obtain the following analysis results.

Copolymer Composition Ratio (Mole Ratio):
Vinyl ruthenocene:4-hydroxystyrene=0.2:0.8
Weight average molecular weight (Mw)=5,100
Molecular weight distribution (Mw/Mn)=1.69

This polymer is designated as Polymer 2.

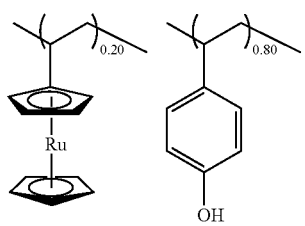

Polymer 2

Synthesis Example 3

Into a 2-L flask were charged 4.2 g of vinyl ferrocene, 5.4 g of 4-hydroxymethylstyrene, and 6.5 g of 4-acetoxystyrene, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol solution to precipitate a white solid, the white solid was redissolved in a mixed solvent of 100 mL of methanol and 200 mL of tetrahydrofurane, 10 g of triethylamine and 10 g of water were added, and a deprotection reaction of the acetyl group was carried out at 70° C. for 5 hours. The resultant was neutralized with acetic acid. The reaction solution was concentrated, and dissolved in 100 mL of acetone. In a similar manner to those shown above, precipitation, filtration, and drying at 60° C. were carried out to obtain a white polymer. A $^{13}$C-NMR, a $^1$H-NMR, and a GPC of the polymer thus obtained were measured to obtain the following analysis results.

Copolymer Composition Ratio (Mole Ratio):
Vinyl ferrocene:4-hydroxymethylstyrene:4-hydroxystyrene=0.2:0.4:0.4
Weight average molecular weight (Mw)=4,600
Molecular weight distribution (Mw/Mn)=1.66

This polymer is designated as Polymer 3.

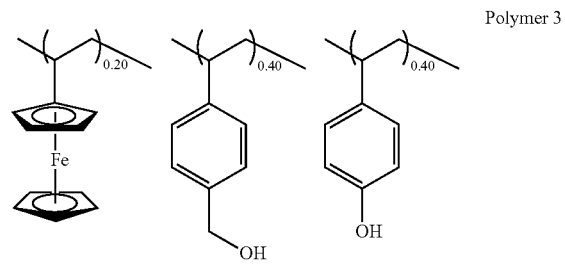

Polymer 3

Synthesis Example 4

Into a 2-L flask were charged 7.1 g of methyl ferrocene methacrylate and 13.4 g of 4-hydroxyphenyl methacrylate, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol to precipitate a white solid, and the white solid was filtered out and dried at 60° C. to obtain a white polymer. A $^{13}$C-NMR, a $^1$H-NMR, and a GPC of the polymer thus obtained were measured to obtain the following analysis results.

Copolymer Composition Ratio (Mole Ratio):
Methyl ferrocene methacrylate:4-hydroxyphenyl methacrylate=0.25:0.75
Weight average molecular weight (Mw)=6,300
Molecular weight distribution (Mw/Mn)=1.76

This polymer is designated as Polymer 4.

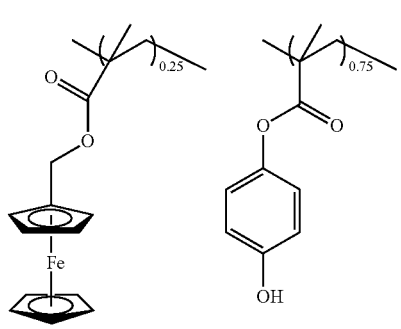

Polymer 4

Synthesis Example 5

Into a 2-L flask were charged 5.7 g of Methyl ferrocene methacrylate, 7.7 g of 4-hydroxymethylphenyl methacrylate, 5.4 g of 4-(1,1,1,3,3,3-hexafluoro-2-hydroxypropyl)styrene, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol for precipitation, and the precipitate was filtered out and dried at 60° C. to obtain a white polymer. A $^{13}$C-NMR, a $^1$H-NMR, and a GPC of the polymer thus obtained were measured to obtain the following analysis results.
Copolymer Composition Ratio (Mole Ratio):
Methyl ferrocene methacrylate:4-hydroxymethylphenyl methacrylate:4-(1,1,1,3,3,3-hexafluoro-2-hydroxypropyl)styrene=0.20:0.40:0.40
Weight average molecular weight (Mw)=6,800
Molecular weight distribution (Mw/Mn)=1.76
This polymer is designated as Polymer 5.

Polymer 5

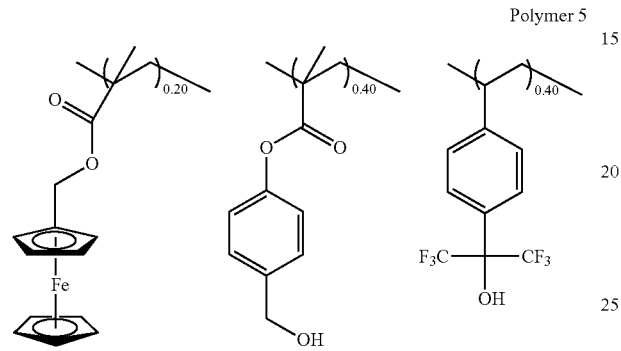

Synthesis Example 6

Into a 2-L flask were charged 5.7 g of Methyl ferrocene methacrylate, 10.7 g of 4-hydroxyphenyl methacrylate, and 5.6 g of PAG monomer 1, and 40 g of tetrahydrofuran was added as a solvent. The flask was cooled to −70° C. under a nitrogen atmosphere, and the procedure of a deaeration under vacuum followed by a nitrogen blow was repeated three times. The flask was heated to a room temperature, 1.2 g of AIBN (azobisisobutyronitrile) was added as a polymerization initiator, the temperature was raised to 60° C., and the reaction was then carried out for 15 hours. The reaction solution was poured into 1-L of isopropyl alcohol for precipitation, and the precipitate was filtered out and dried at 60° C. to obtain a white polymer. A $^{13}$C-NMR, a $^1$H-NMR, and a GPC of the polymer thus obtained were measured to obtain the following analysis results.
Copolymer Composition Ratio (Mole Ratio):
Methyl ferrocene methacrylate:4-hydroxyphenyl methacrylate:PAG monomer 1=0.25:0.65:0.10
Weight average molecular weight (Mw)=7,300
Molecular weight distribution (Mw/Mn)=1.74
This polymer is designated as Polymer 6.

Polymer 6

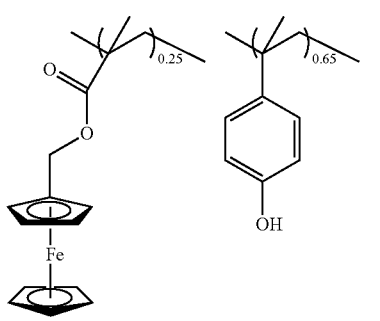

-continued

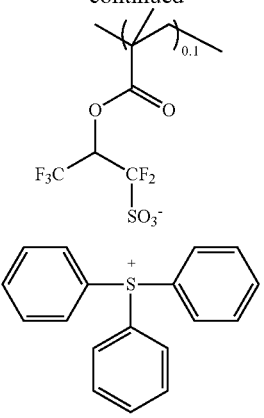

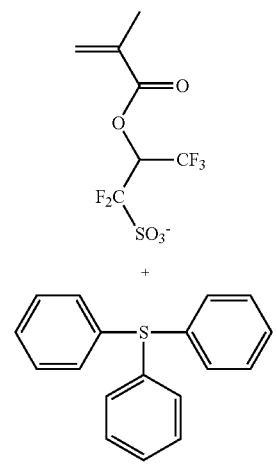

PAG monomer 1: triphenylsulfonium 1,1,3,3,3-pentafluoro-2-methacryloyloxypropane-1-sulfonate

Comparative Synthesis Example 1

In a similar manner to that of the Synthesis Examples, the following two-component polymer was synthesized.
A $^{13}$C-NMR, a $^1$H-NMR, and a GPC of the polymer thus obtained were measured to obtain the following analysis results.
Copolymer Composition Ratio (Mole Ratio):
4-Hydroxystyrene:styrene=0.7:0.3
Weight average molecular weight (Mw)=4,500
Molecular weight distribution (Mw/Mn)=1.55

This polymer is designated as Comparative Polymer 1.

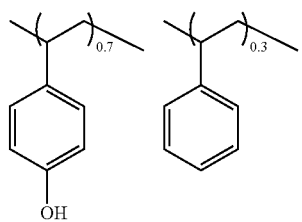

Comparative Polymer 1

Comparative Synthesis Example 2

In a similar manner to that of the Synthesis Examples, the following two-component polymer was synthesized.

A $^{13}$C-NMR, a $^1$H-NMR, and a GPC of the polymer thus obtained were measured to obtain the following analysis results.
Copolymer Composition Ratio (Mole Ratio):
4-Hydroxystyrene:1-vinyl naphthalene=0.8:0.2
Weight average molecular weight (Mw)=5,900
Molecular weight distribution (Mw/Mn)=1.51

This polymer is designated as Comparative Polymer 2.

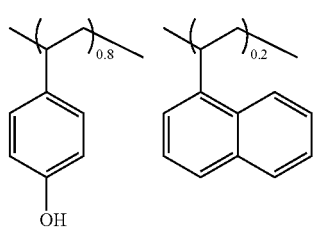

Comparative Polymer 2

Preparation of Negative Resist Composition

Each of the polymers (Polymers 1 to 6, and Comparative Polymers 1 and 2) synthesized above, an acid generator (PAG 1), a basic compound (Amine 1), and cross-linking agent (CR 1) which were represented by the following formulae, in a composition shown in Table 1 were dissolved in an organic solvent to prepare a resist composition. Each of the compositions was filtered through a filter with a size of 0.2 μm, to prepare a resist solution.

Each composition in Table 1 is as follows.
Polymers 1 to 6: In Synthesis Examples 1 to 6
Comparative Polymers 1 and 2: In Comparative Synthesis Examples 1 and 2
Acid generator: PAG 1 (see the following structural formula)
Basic compound: Amine 1 (see the following structural formula)

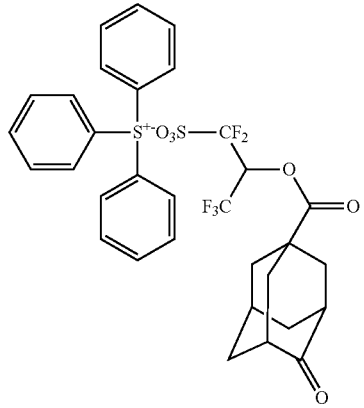

PAG 1

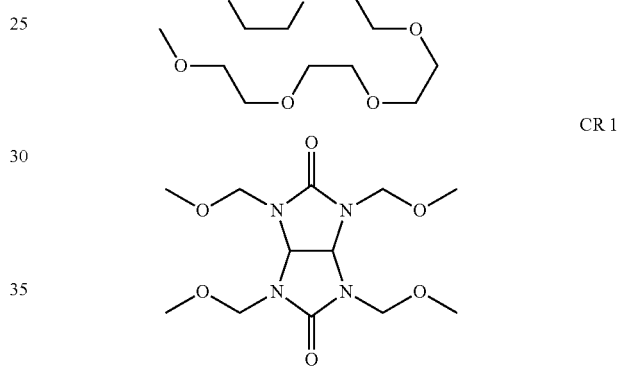

Amine 1

CR 1

Organic solvent: PGMEA (propylene glycol methyl ether acetate), CyH (cyclohexanone), CyP (cyclopentanone)

Evaluation of Electronic Beam Drawing

Each of the negative resist compositions prepared (Examples 1 to 6 and Comparative Examples 1 and 2) was applied by spin coating with a Clean Track Mark 5 (manufactured by Tokyo Electron Ltd.) to a Si substrate with a diameter of 6 inch (200 mm), and then pre-baked on a hot plate at 110° C. for 90 seconds to prepare a resist film with a thickness of 100 nm. The resist film was subjected to drawing in a vacuum chamber with a HL-800D (manufactured by Hitachi, Ltd.) at an HV voltage of 50 keV.

Immediately after the drawing, post exposure bake (PEB) was carried out on a hot plate at 110° C. for 90 seconds with a Clean Track Mark 5 (manufactured by Tokyo Electron Ltd.), and then puddle-developed in a 2.38% by mass aqueous TMAH solution for 30 seconds to obtain a negative pattern.

The obtained resist pattern was evaluated as follows.

An edge roughness of a 120-nm LS was measured with a SEM at an exposure dose to resolve a 0.12-μm line-and-space at 1:1 as a sensitivity of a resist.

The resist composition is shown in Table 1 along with the sensitivity and resolution of EB lithography.

TABLE 1

| | Polymer (part by mass) | Acid generator (part by mass) | Basic compound (part by mass) | Cross-linking agent (part by mass) | Organic solvent (part by mass) | PEB temp. (°C.) | Sensitivity ($\mu C/cm^2$) | Resolution (nm) | LWR (nm) |
|---|---|---|---|---|---|---|---|---|---|
| Example 1-1 | Polymer 1 (100) | PAG 1 (20) | Amine 1 (1.0) | CR 1 (10) | PGMEA (2000) | 95 | 25.6 | 75 | 6.7 |
| Example 1-2 | Polymer 2 (100) | PAG 1 (20) | Amine 1 (1.0) | CR 1 (10) | PGMEA (1500) CyH (500) | 95 | 25.6 | 75 | 6.8 |
| Example 1-3 | Polymer 3 (100) | PAG 1 (20) | Amine 1 (1.0) | — | PGMEA (1500) CyH (500) | 95 | 26.3 | 75 | 6.4 |
| Example 1-4 | Polymer 4 (100) | PAG 1 (20) | Amine 1 (1.0) | CR 1 (10) | PGMEA (1500) CyH (500) | 95 | 25.0 | 75 | 6.1 |
| Example 1-5 | Polymer 5 (100) | PAG 1 (20) | Amine 1 (1.0) | — | CyH (500) Cyp (1800) | 95 | 24.3 | 75 | 6.3 |
| Example 1-6 | Polymer 6 (100) | — | Amine 1 (1.0) | CR 1 (10) | CyH (500) Cyp (1800) | 95 | 23.0 | 70 | 5.2 |
| Comparative Example 1-1 | Comparative polymer 1 (100) | PAG 1 (12) | Amine 1 (1.0) | CR 1 (10) | PGMEA (2000) | 95 | 28.5 | 90 | 8.9 |
| Comparative Example 1-2 | Comparative polymer 2 (100) | PAG 1 (12) | Amine 1 (1.0) | CR 1 (10) | PGMEA (2000) | 95 | 33.6 | 90 | 8.9 |

As seen from the results in Table 1, the resist compositions in Examples 1 to 6 have a higher sensitivity, a higher resolution, and a better edge roughness after the exposure than the resist compositions in Comparative Examples 1 and 2.

Evaluation of Dry Etching Resistance

In a test of dry etching resistance, 2 g each of the polymers synthesized (Polymers 1 to 6 and Comparative Polymers 1 and 2) was dissolved in 10 g of cyclohexanone. The mixture was filtered through a filter with a size of 0.2 μm to obtain a polymer solution. The polymer solution was applied to a Si substrate by spin coating to obtain a film with a thickness of 300 nm. The evaluation was made in the following conditions.

Etching Tests in $CHF_3/CF_4$ Gas

A difference in the thickness of the polymer film before and after the etching was measured with a dry etching apparatus TE-8500P (manufactured by Tokyo Electron Ltd.). The etching rate per minute was determined.

The etching conditions are as follows.

| | |
|---|---|
| Chamber pressure: | 40.0 Pa |
| RF power: | 1,000 W |
| Gap: | 9 mm |
| $CHF_3$ gas flow rate: | 30 ml/min |
| $CF_4$ gas flow rate: | 30 ml/min |
| Ar gas flow rate: | 100 ml/min |
| Time: | 60 sec |

In this evaluation, when the difference in film thickness is small, that is, the reduction amount is small, the film is judged to have the etching resistance.

The results of dry etching resistance are shown in Table 2.

TABLE 2

| | $CHF_3/CF_4$ gas etching rate (mm/min) |
|---|---|
| Polymer 1 | 55 |
| Polymer 2 | 55 |
| Polymer 3 | 53 |
| Polymer 4 | 65 |
| Polymer 5 | 62 |
| Polymer 6 | 67 |
| Comparative Polymer 1 | 122 |
| Comparative Polymer 2 | 100 |

From the results in Table 2, it was confirmed that the polymers containing a repeating unit "a" having a cyclopentadienyl complex according to the present invention (Polymers 1 to 6) have a higher dry etching resistance than Comparative Polymers 1 and 2.

The present invention is not restricted to the embodiments shown above. The embodiments are merely examples so that any embodiments composed of substantially the same technical concept as disclosed in the claims of the present invention and expressing a similar effect are included in the technical scope of the present invention.

What is claimed is:

1. A negative resist composition comprising, as a base resin, a polymer that contains at least a repeating unit "a" having a cyclopentadienyl complex and is represented by the following general formula (1),

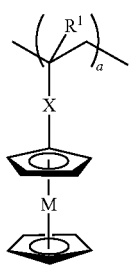

wherein $R^1$ represents a hydrogen atom or a methyl group; X represents a single bond, a methylene group, $-C(=O)-O-R^2-$, $-O-R^2-$, $-O-C(=O)-R^2-$, or $-Ar-R^2-$; "M" represents Fe, Co, Ni, Cr, or Ru; Ar represents a phenylene group or a naphthylene group; $R^2$ is the same or different single bond, a linear, a branched, or a cyclic alkylene group having 3 to 6 carbon atoms, an arylene group having 6 to 10 carbon atoms, or an alkenylene group having 2 to 10 carbon atoms, may contain an ester group or an ether group; and "a" represents within a range of $0<a<1.0$.

2. The negative resist composition according to claim 1, wherein the base resin is a polymer that contains the repeating unit "a" in the general formula (1) and a repeating unit "b" having a hydroxy group and is represented by the following general formula (2),

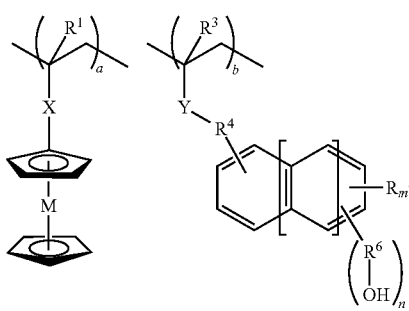

wherein $R^1$, X, and M are as defined above; $R^3$ represents a hydrogen atom or a methyl group; Y represents a single bond, $-C(=O)-O-$, or $-C(=O)-NH-$; $R^4$ represents a single bond or a linear or a branched alkylene groups having 1 to 6 carbon atoms; $R^5$ represents a hydrogen atom, a fluorine atom, a trifluoromethyl group, a cyano group, or a linear, a branched, or a cyclic alkyl group, alkoxy group, alkoxycarbonyl group, acyl group, or acyloxy group having 1 to 6 carbon atoms; $R^6$ represents a single bond or a linear or a branched alkylene groups having 1 to 4 carbon atoms; "m" represents an integer of 0 to 4; "n" represents 1 or 2, "a" represents within a range of $0<a<1.0$; and "b" represents within "a" range of $0<b<1.0$.

3. The negative resist composition according to claim 1, wherein the polymer has a weight average molecular weight of 1,000 to 500,000.

4. The negative resist composition according to claim 2, wherein the polymer has a weight average molecular weight of 1,000 to 500,000.

5. The negative resist composition according to claim 1, which further comprises an acid generator and is a chemically amplified negative resist composition.

6. The negative resist composition according to claim 2, which further comprises an acid generator and is a chemically amplified negative resist composition.

7. The negative resist composition according to claim 3, which further comprises an acid generator and is a chemically amplified negative resist composition.

8. The negative resist composition according to claim 4, which further comprises an acid generator and is a chemically amplified negative resist composition.

9. The negative resist composition according to claim 1, further comprising any one or more of an organic solvent, a basic compound, a dissolution control agent, a surfactant, and a cross-linking agent.

10. The negative resist composition according to claim 2, further comprising any one or more of an organic solvent, a basic compound, a dissolution control agent, a surfactant, and a cross-linking agent.

11. The negative resist composition according to claim 3, further comprising any one or more of an organic solvent, a basic compound, a dissolution control agent, a surfactant, and a cross-linking agent.

12. The negative resist composition according to claim 4, further comprising any one or more of an organic solvent, a basic compound, a dissolution control agent, a surfactant, and a cross-linking agent.

13. The negative resist composition according to claim 5, further comprising any one or more of an organic solvent, a basic compound, a dissolution control agent, a surfactant, and a cross-linking agent.

14. The negative resist composition according to claim 6, further comprising any one or more of an organic solvent, a basic compound, a dissolution control agent, a surfactant, and a cross-linking agent.

15. The negative resist composition according to claim 7, further comprising any one or more of an organic solvent, a basic compound, a dissolution control agent, a surfactant, and a cross-linking agent.

16. The negative resist composition according to claim 8, further comprising any one or more of an organic solvent, a basic compound, a dissolution control agent, a surfactant, and a cross-linking agent.

17. A patterning process comprising the steps of applying the negative resist composition according to claim 1 to a substrate, heating the composition, exposing the composition to high-energy beam, and developing the composition with a developer.

* * * * *